(12) United States Patent
Park et al.

(10) Patent No.: US 12,388,022 B2
(45) Date of Patent: Aug. 12, 2025

(54) SEMICONDUCTOR DEVICE

(71) Applicant: SAMSUNG ELECTRONICS CO., LTD., Suwon-si (KR)

(72) Inventors: Jun Ki Park, Hwaseong-si (KR); Yoon Tae Hwang, Seoul (KR); Wan Don Kim, Seongnam-si (KR); Sung Hwan Kim, Hwaseong-si (KR); Tae Yeol Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 590 days.

(21) Appl. No.: 17/885,025

(22) Filed: Aug. 10, 2022

(65) Prior Publication Data
US 2023/0163076 A1    May 25, 2023

(30) Foreign Application Priority Data
Nov. 25, 2021    (KR) .................. 10-2021-0164581

(51) Int. Cl.
| | | |
|---|---|---|
| H01L 23/535 | (2006.01) | |
| H01L 21/768 | (2006.01) | |
| H01L 23/485 | (2006.01) | |
| H01L 23/522 | (2006.01) | |
| H01L 23/528 | (2006.01) | |
| H10D 30/01 | (2025.01) | |
| H10D 30/62 | (2025.01) | |

(52) U.S. Cl.
CPC ...... *H01L 23/535* (2013.01); *H01L 21/76804* (2013.01); *H01L 21/76805* (2013.01); *H01L 21/76895* (2013.01); *H01L 23/5283* (2013.01)

(58) Field of Classification Search
CPC ......... H01L 21/76805; H01L 21/76895; H01L 23/5283; H01L 23/5226; H01L 23/485; H01L 23/535
See application file for complete search history.

(56) References Cited

U.S. PATENT DOCUMENTS

| | | |
|---|---|---|
| 8,409,941 B2 | 4/2013 | Yin et al. |
| 9,337,105 B1 | 5/2016 | Kwon et al. |
| 9,853,110 B2 | 12/2017 | Zhang et al. |
| 9,893,062 B2 | 2/2018 | Shen et al. |
| 10,522,403 B2 | 12/2019 | Stephens et al. |
| 10,763,335 B2 | 9/2020 | Chung et al. |
| 10,950,728 B2 | 3/2021 | Chang et al. |

(Continued)

*Primary Examiner* — Mohsen Ahmadi
(74) *Attorney, Agent, or Firm* — Morgan, Lewis & Bockius LLP

(57) ABSTRACT

A semiconductor device includes a gate structure including a gate electrode on a substrate. A source/drain pattern is on the substrate and positioned on a side surface of the gate electrode. A source/drain contact is on the source/drain pattern. A first conductive pad is on the source/drain contact. A second conductive pad is on the gate structure. A via plug penetrates the first conductive pad and is connected to the source/drain contact. A gate contact penetrates the second conductive pad and is connected to the gate electrode. A portion of the via plug protrudes from the first conductive pad. A portion of the gate contact protrudes from the second conductive pad. A height from an upper surface of the gate structure to an upper surface of the via plug is equal to a height from the upper surface of the gate structure to an upper surface of the gate contact.

20 Claims, 39 Drawing Sheets

(56) References Cited

U.S. PATENT DOCUMENTS

| | | | |
|---|---|---|---|
| 2020/0013871 A1* | 1/2020 | An | H10D 64/689 |
| 2021/0098365 A1* | 4/2021 | Chou | H10D 30/797 |
| 2022/0130970 A1* | 4/2022 | Kang | H01L 23/5226 |
| 2022/0310811 A1* | 9/2022 | Min | H10D 84/038 |
| 2022/0319862 A1* | 10/2022 | Chang | H01L 21/0337 |

* cited by examiner

SEMICONDUCTOR DEVICE

CROSS-REFERENCE TO RELATED APPLICATION

This application claims priority under 35 U.S.C. § 119 to Korean Patent Application No. 10-2021-0164581, filed on Nov. 25, 2021 in the Korean Intellectual Property Office, the disclosure of which is incorporated by reference in its entirety herein.

1. TECHNICAL FIELD

The present disclosure relates to a semiconductor device.

2. DISCUSSION OF RELATED ART

A scaling technology for increasing the density of semiconductor devices has been proposed having a multi gate transistor in which a multi-channel active pattern (e.g., a silicon body) having a fin or nanowire shape is formed on a substrate and a gate is formed on a surface of the multi-channel active pattern.

Since such a multi gate transistor utilizes a three-dimensional channel, scaling is easily performed. Further, even if a gate length of the multi gate transistor is not increased, the current control capability may be increased. Furthermore, a SCE (short channel effect) in which potential of a channel region is influenced by a drain voltage may be effectively suppressed.

On the other hand, as a pitch size of the semiconductor device decreases, the semiconductor device should have a decrease in capacitance and an increase in electrical stability between contacts.

SUMMARY

Aspects of the present disclosure provide a semiconductor device capable of increasing element performance and reliability.

Aspects of the present disclosure also provide a method for manufacturing the semiconductor device capable of increasing element performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a semiconductor device includes a gate structure including a gate electrode on a substrate. A source/drain pattern is disposed on the substrate and is positioned on a side surface of the gate electrode. A source/drain contact is disposed on the source/drain pattern and is connected to the source/drain pattern. A first conductive pad is on the source/drain contact. A second conductive pad is on the gate structure. A via plug penetrates the first conductive pad and is connected to the source/drain contact. A gate contact penetrates the second conductive pad and is connected to the gate electrode. A portion of the via plug protrudes from an upper surface of the first conductive pad. A portion of the gate contact protrudes from an upper surface of the second conductive pad. A height from an upper surface of the gate structure to an upper surface of the via plug is equal to a height from the upper surface of the gate structure to an upper surface of the gate contact.

According to an embodiment of the present disclosure, a semiconductor device includes a gate structure on a substrate. The gate structure includes a gate electrode and a gate capping, pattern on the gate electrode. A source/drain pattern is disposed on the substrate and is positioned on a side surface of the gate electrode. A source/drain contact is disposed on the source/drain pattern and is connected to the source/drain pattern. A first conductive pad is on the source/drain contact. A second conductive pad is on the gate capping pattern. A via plug penetrates the first conductive pad and is connected to the source/drain contact. A gate contact penetrates the second conductive pad and the gate capping pattern, and is connected to the gate electrode. A width of the via plug decreases as a distance from an upper surface of the first conductive pad increases. A width of the gate contact decreases as a distance from an upper surface of the second conductive pad increases.

According to an embodiment of the present disclosure, a semiconductor device includes a multi-channel active pattern on a substrate. A gate structure is disposed on the multi-channel active pattern. The gate structure includes a gate electrode and a gate capping pattern. The gate capping pattern is disposed on the gate electrode. A source/drain pattern is disposed on the substrate and is positioned on a side surface of the gate electrode. A source/drain contact is disposed on the source/drain pattern and is connected to the source/drain pattern. A first conductive pad is on the source/drain contact. A second conductive pad is on the gate capping pattern. A via plug penetrates the first conductive pad and is connected to the source/drain contact. A gate contact penetrates the second conductive pad and the gate capping pattern and is connected to the gate electrode. The via plug includes a lower via plug disposed in the first conductive pad and an upper via plug on the lower via plug. The gate contact includes a lower gate contact disposed in the second conductive pad and an upper gate contact on the lower gate contact. A width of an upper surface of the upper via plug is less than a width of a lower surface of the via plug disposed on an upper surface of the first conductive pad. A width of an upper surface of the upper gate contact is less than a width of a lower surface of the gate contact disposed on an upper surface of the second conductive pad.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Although drawings of a semiconductor device according to some embodiments show a fin type transistor (FinFET) including a channel region of a fin-type pattern shape, a transistor including a nanowire or a nanosheet, and a MBCFET™ (Multi-Bridge Channel Field Effect Transistor) as an example, embodiments of the present disclosure are not necessarily limited thereto. The semiconductor device according to some embodiments may, of course, include a tunneling transistor (tunneling FET) or a three-dimensional (3D) transistor. The technical idea of the present disclosure may be applied to a planar transistor, and the semiconductor device according to some embodiments may include a planar transistor to which the technical idea of the present disclosure is applied. In addition, the technical idea of the present disclosure may be applied to transistors based on two-dimensional materials (2D material based FETs) and a heterostructure thereof.

Further, the semiconductor device according to some embodiments may also include a bipolar junction transistor, a laterally diffused metal oxide semiconductor (LDMOS), or the like.

A semiconductor device according to some embodiments will be described referring to FIGS. 1 to 6.

Figure 1:
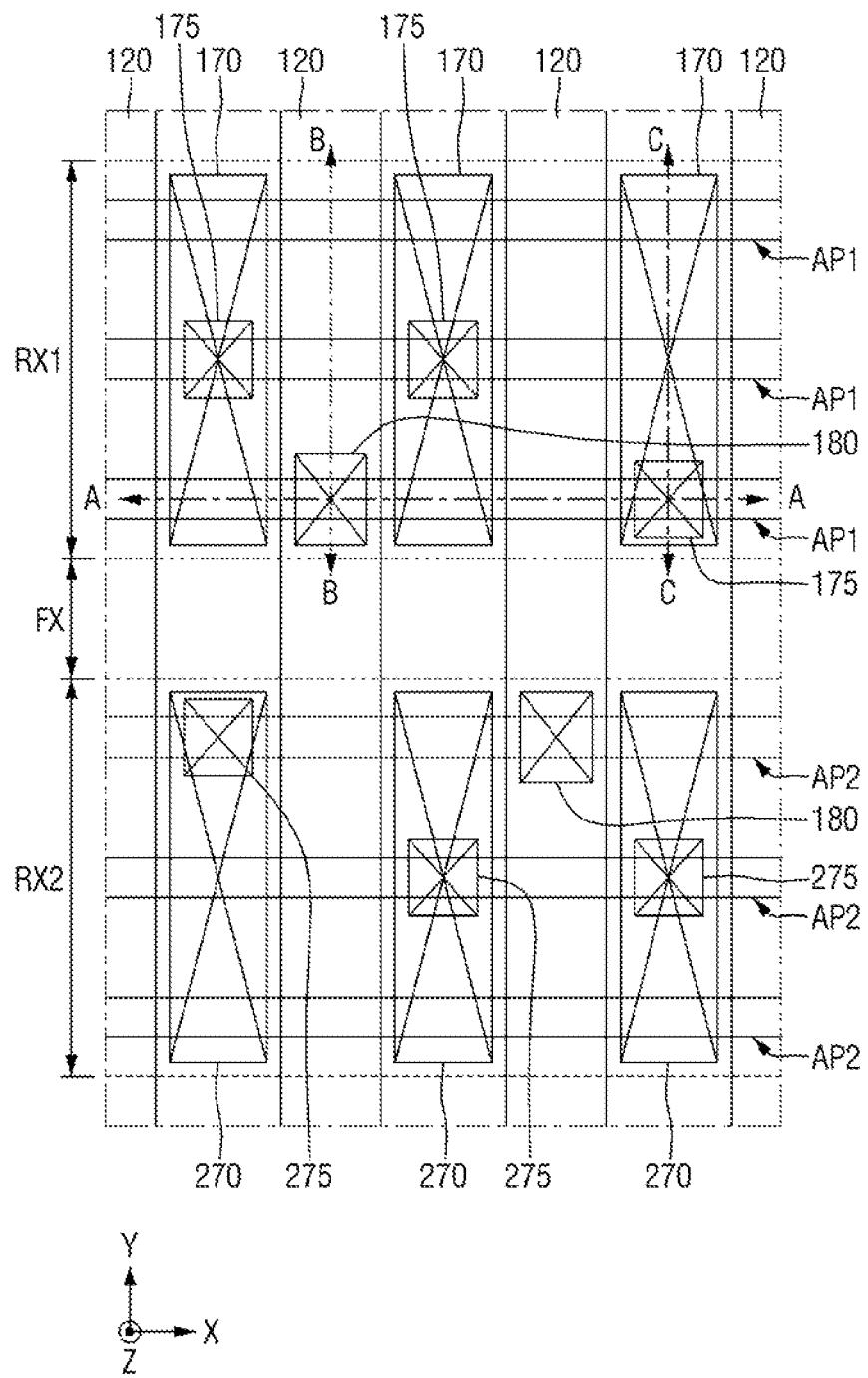
FIG. 1 is a layout diagram of a semiconductor device according to an embodiment of the present disclosure.
Figure 2:
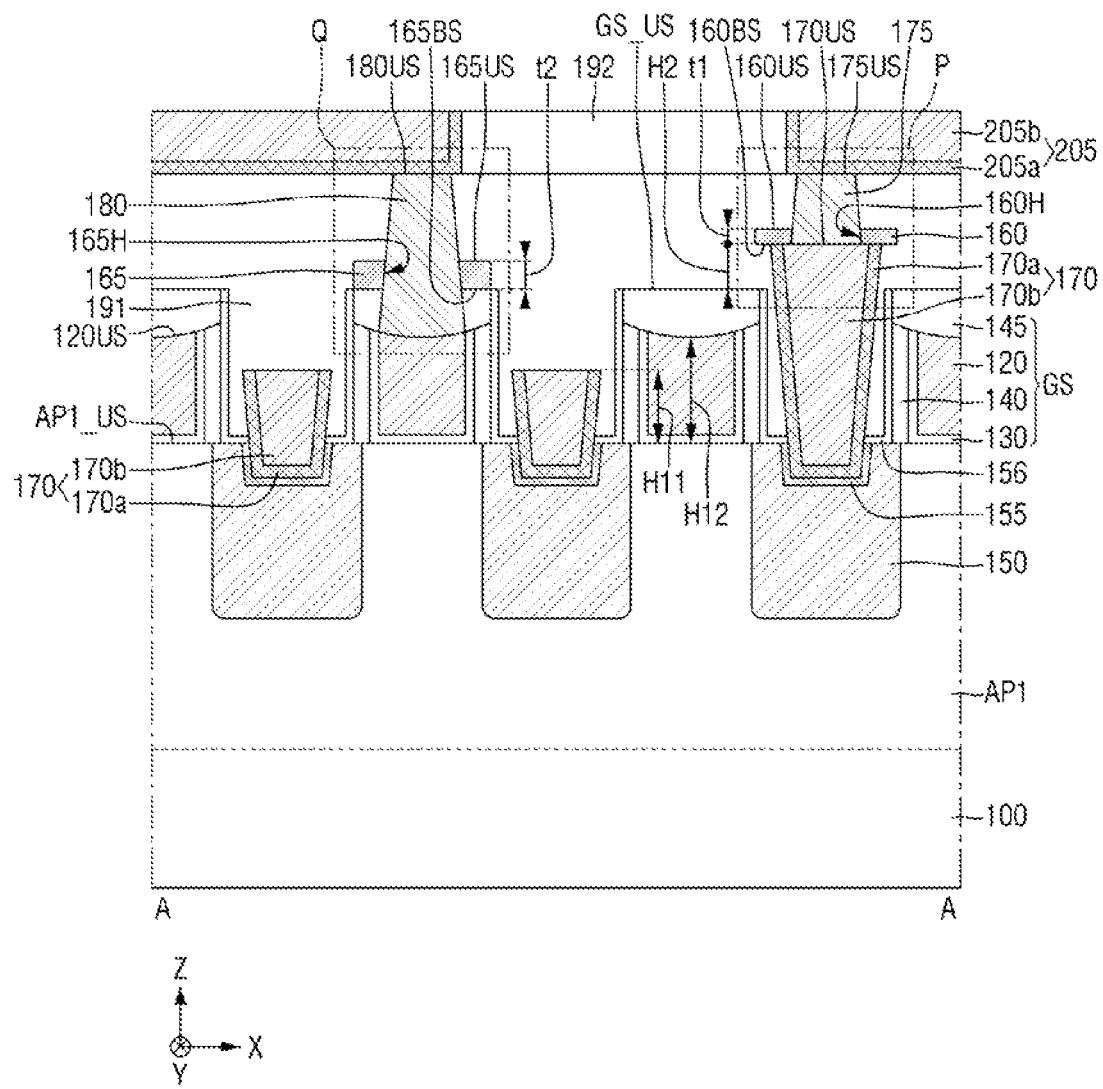
FIG. 2 is a cross-sectional view of a semiconductor device taken along line A-A of FIG. 1 according to an embodiment of the present disclosure.
Figure 3:
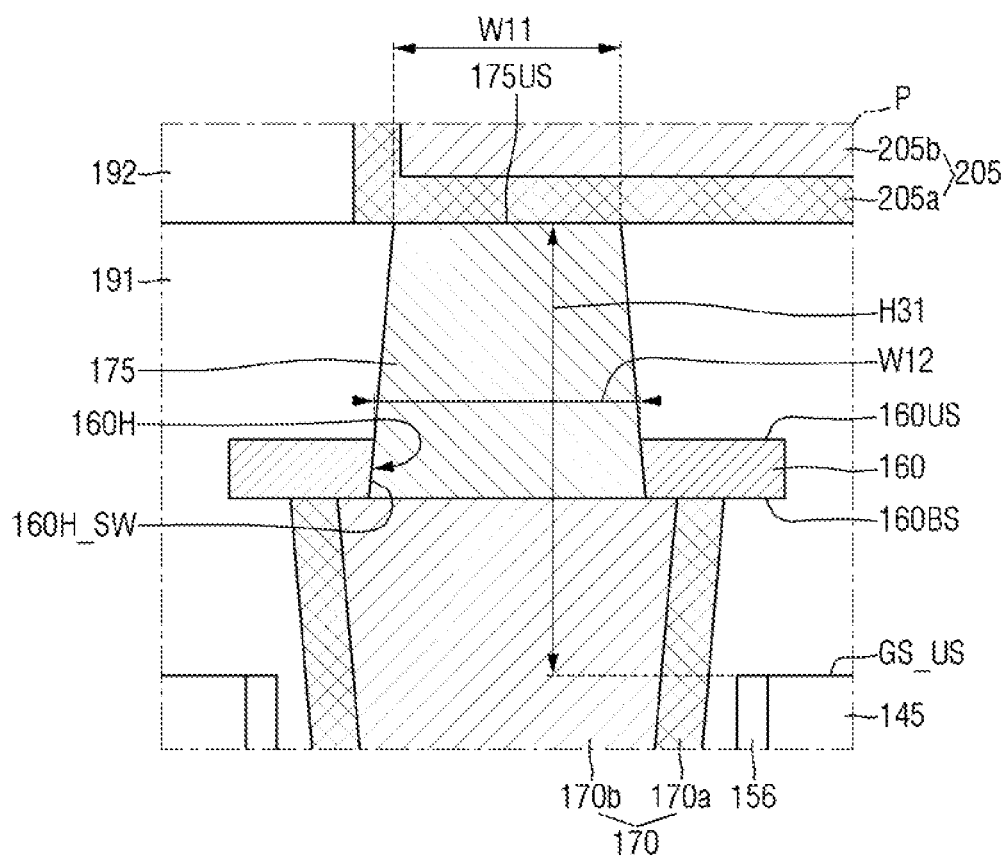
FIG. 3 is an enlarged cross-sectional view of a semiconductor device showing a portion P of FIG. 2 according to an embodiment of the present disclosure.
Figure 4:
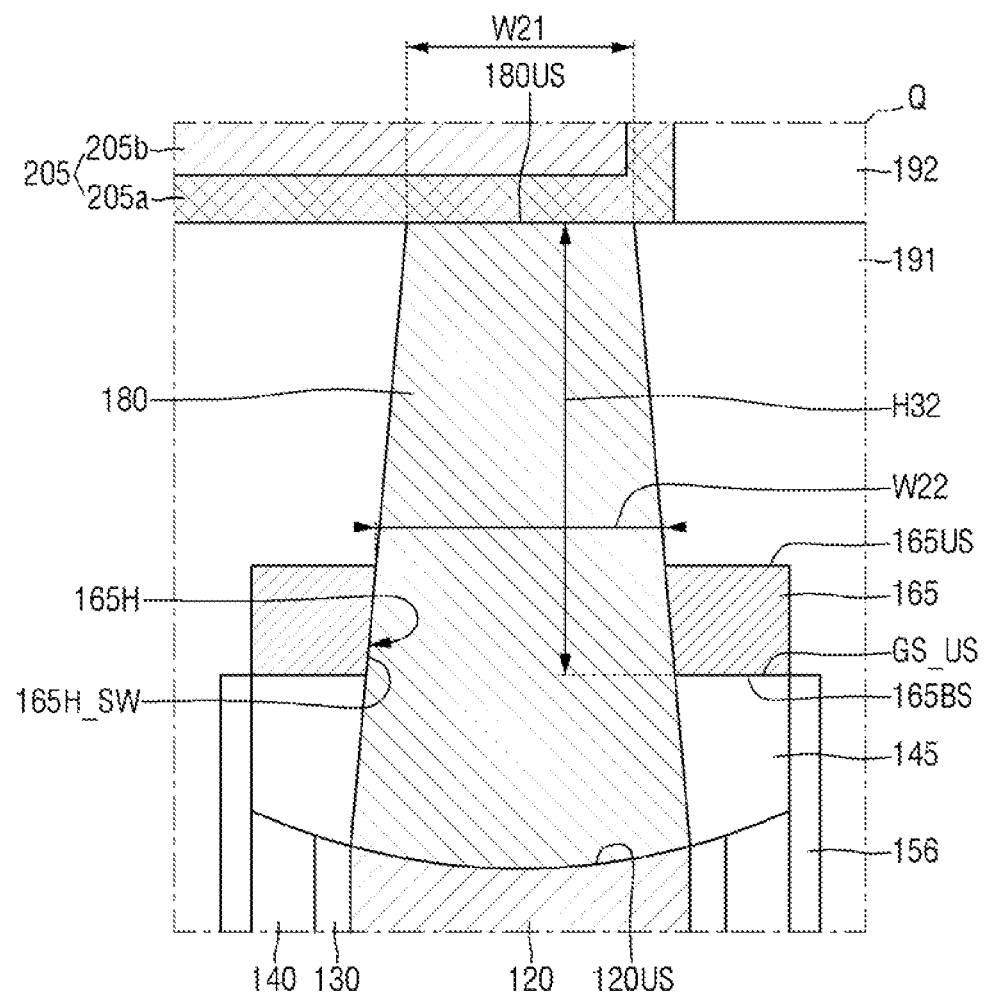
FIG. 4 is an enlarged cross-sectional view of a semiconductor device showing a portion Q of FIG. 2 according to an embodiment of the present disclosure.
Figure 5:
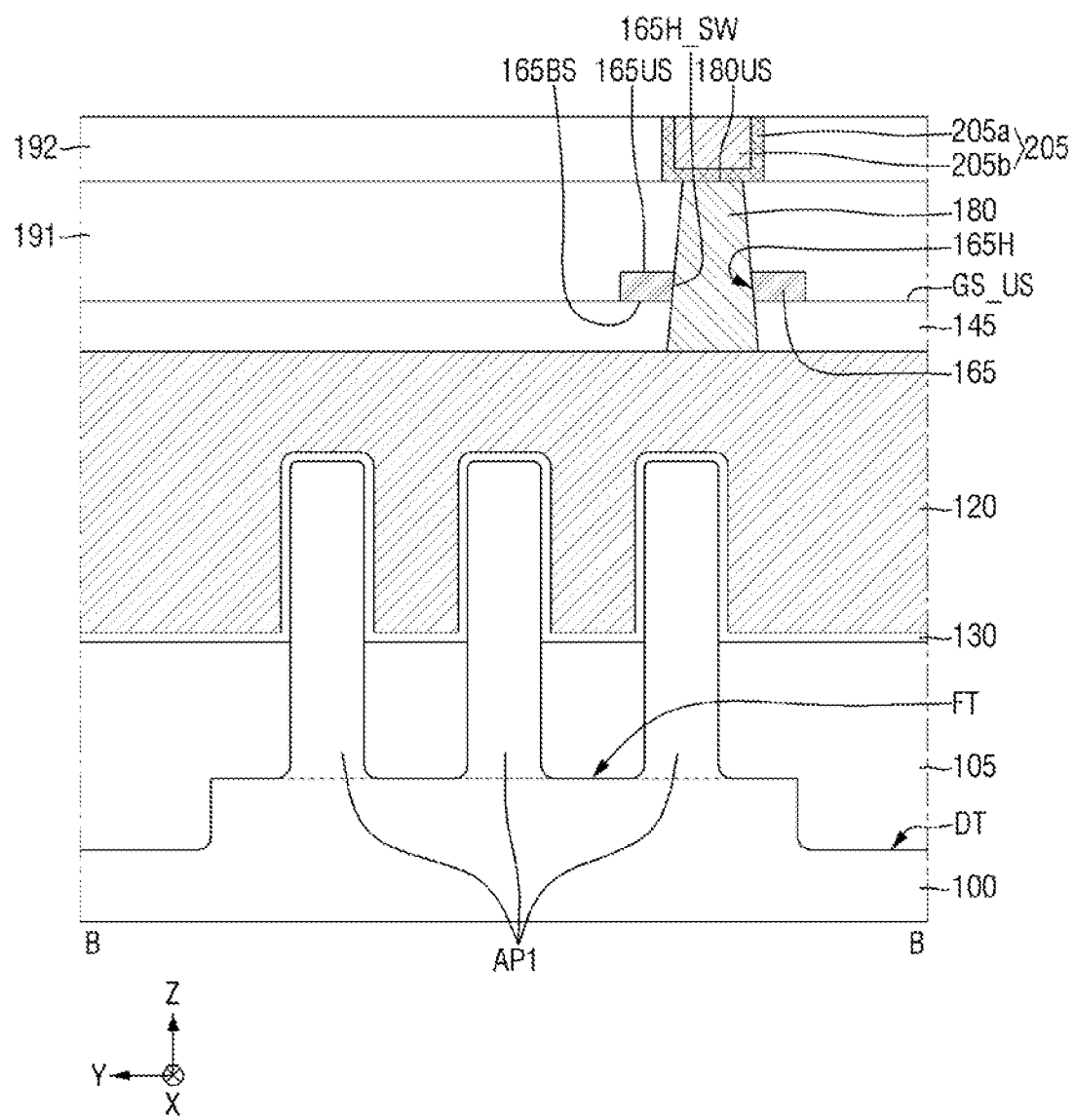
FIG. 5 is a cross-sectional view of a semiconductor device taken along line B-B of FIG. 1 according to an embodiment of the present disclosure.
Figure 6:
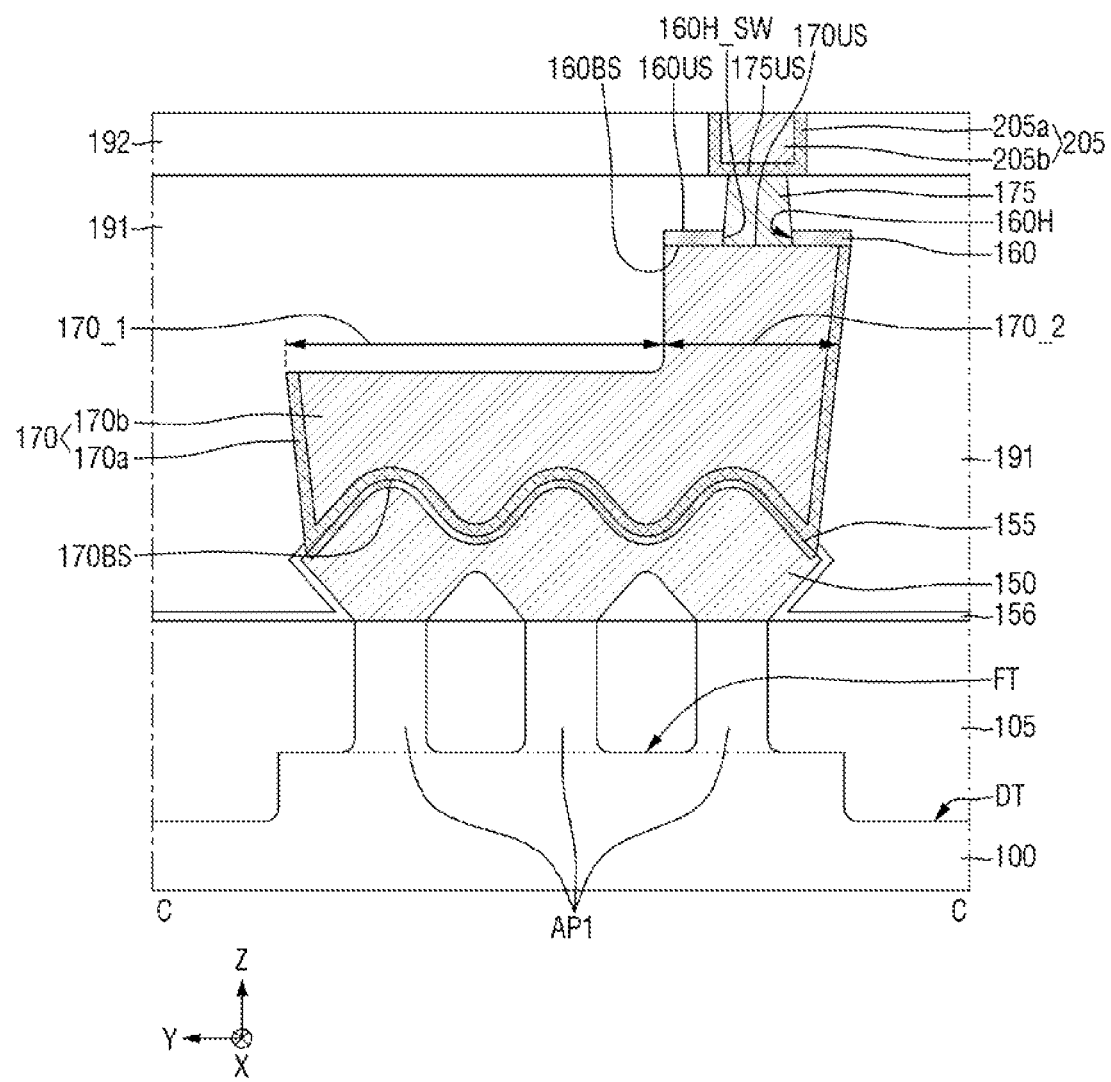
FIG. 6 is a cross-sectional view of a semiconductor device taken along line C-C of FIG. 1 according to an embodiment of the present disclosure.

FIG. 1 is a layout diagram for explaining the semiconductor device according to some embodiments. FIG. 2 is a cross-sectional view taken along A-A of FIG. 1. FIG. 3 is an enlarged view showing a portion P of FIG. 2. FIG. 4 is an enlarged view showing a portion Q of FIG. 2. FIG. 5 is a cross-sectional view taken along B-B of FIG. 1. FIG. 6 is a cross-sectional view taken along C-C of FIG. 1. For convenience of explanation, FIG. 1 does not show a wiring line 205.

For reference, a via plug 175 and a gate contact 180 are shown to be disposed adjacent to each other in a first direction X on a single first active pattern AP1. However, such arrangement of the via plug 175 and the gate contact 180 is merely for convenience of explanation and embodiments of the present disclosure are not necessarily limited thereto.

Referring to FIGS. 1 to 6, a semiconductor device according to some embodiments may include at least one first active patterns AP1, at least one second active patterns AP2, at least one gate electrodes 120, a first source/drain contact 170, a second source/drain contact 270, a gate contact 180, a first conductive pad 160, a second conductive pad 165, a first via plug 175, a second via plug 275, and a wiring line 205.

The substrate 100 may include a first active region RX1, a second active region RX2, and a field region FX. The field region FX may be formed directly adjacent to the first active region RX1 and the second active region RX2. The field region FX may form a boundary with the first active region RX1 and the second active region RX2.

The first active region RX1 and the second active region RX2 are spaced apart from each other (e.g., in a second direction Y). The first active region RX1 and the second active region RX2 may be separated by the field region FX.

For example, the field insulating film 105 may be disposed around the first active region RX1 and the second active region RX2 spaced apart from each other. In an embodiment, a portion of the field insulating film 105 between the first active region RX1 and the second active region RX2 may be the field region FX. In an embodiment in which the semiconductor device includes a transistor, a portion in which a channel region of the transistor is formed may be an active region, and a portion which divides the channel region of the transistor formed in the active region may be a field region. Alternatively, the active region may be a portion in which fin-type patterns or nanosheets used as the channel region of the transistor are formed, and the field region may be a region in which the fin-type pattern or nanosheet used as the channel region is not formed.

As shown in FIGS. 5 and 6, the field region FX may be defined by a deep trench DT. However, embodiments of the present disclosure are not necessarily limited thereto. In addition, one of ordinary skill in the art in the technical field to which the present disclosure belongs may distinguish which part is the field region and which part is the active region.

As an example, one of the first active region RX1 and the second active region RX2 may be a PMOS formation region and the other may be an NMOS formation region. As another example, the first active region RX1 and the second active region RX2 may both be a PMOS formation region. As yet another example, the first active region RX1 and the second active region RX2 may be the NMOS formation region.

In an embodiment, the substrate 100 may be a silicon substrate or an SOI (silicon-on-insulator). In an embodiment, the substrate 100 may include, but is not necessarily limited to, silicon germanium, SGOI (silicon germanium on insulator), indium antimonide, lead tellurium compounds, indium arsenic, indium phosphide, gallium arsenide or gallium antimonide.

At least one or more first active patterns AP1 may be formed in the first active region RX1. The first active pattern AP1 may protrude from the substrate 100 of the first active region RX1. In an embodiment, the first active pattern AP1 may extend along the first direction X on the substrate 100. The first active pattern AP1 may be defined by a fin trench FT extending in the first direction X.

For example, the first active pattern AP1 may include a long side extending in the first direction X, and a short side extending in the second direction Y. Here, the first direction X may intersect the second direction Y and the third direction Z. Also, the second direction Y may intersect the third direction Z. The third direction Z may be a thickness direction of the substrate 100. The first and second directions X, Y may be parallel to an upper surface of the substrate 100.

At least one or more second active patterns AP2 may be formed on the second active region RX2. A description of the second active pattern AP2 may be substantially the same as the description of the first active pattern AP1 and a repeated description may be omitted for convenience of explanation.

The first active pattern AP1 and the second active pattern AP2 may each be a multi-channel active pattern. In the semiconductor device according to some embodiments, each of the first active pattern AP1 and the second active pattern AP2 may be, for example, a fin-type pattern.

The first active pattern AP1 and the second active pattern AP2 may each be used as the channel region of the transistor. Although the number of each of the first active patterns AP1 and second active patterns AP2 is shown as three, this is merely for convenience of explanation, and embodiments of the present disclosure are not necessarily limited thereto. The number of each of the first active patterns AP1 and second active patterns AP2 may be one or more.

Each of the first active pattern AP1 and the second active pattern AP2 may be a part of the substrate 100, and may include an epitaxial layer that is grown from the substrate 100. In an embodiment, the first active pattern AP1 and the second active pattern AP2 may include, for example, silicon or germanium, which is an elemental semiconductor material. Further, the first active pattern AP1 and the second active pattern AP2 may include a compound semiconductor, and may include, for example, a group IV-IV compound semiconductor or a group III-V compound semiconductor.

In an embodiment, the group IV-IV compound semiconductor may be, for example, a binary compound or a ternary compound including at least two OF more of carbon (C), silicon (Si), germanium (Ge) and tin (Sn), or a compound obtained by doping these elements with a group IV element.

In an embodiment, the group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

As an example, the first active pattern AP1 and the second active pattern AP2 may include the same material. For example, the first active pattern AP1 and the second active pattern AP2 may be silicon fin-type patterns, respectively. Alternatively, for example, the first active pattern AP1 and the second active pattern AP2 may be fin-type patterns including a silicon-germanium pattern, respectively. In an embodiment, the first active pattern AP1 and the second active pattern AP2 may include different materials from each other. For example, the first active pattern AP1 may be a silicon fin-type pattern and the second active pattern AP2 may be a fin-type pattern including a silicon-germanium pattern.

The field insulating film 105 may be formed on the substrate 100. The field insulating film 105 may be formed over the first active region RX1, the second active region RX2, and the field region FX. The field insulating film 105 may fill the deep trench DT.

The field insulating film 105 may be formed on a part of the side walls of the first active pattern AP1 and a part of the side walls of the second active pattern AP2. The first active pattern AP1 and the second active pattern AP2 may each protrude upward from the upper surface of the field insulating film 105 (e.g., in the third direction Z). In an embodiment, the field insulating film 105 may include, for example, an oxide film, a nitride film, an oxynitride film or a combination film thereof.

At least one or more gate structures GS may be disposed on the substrate 100. For example, at least one or more gate structures GS may be disposed on the field insulating film 105. The gate structure GS may extend in the second direction Y. The adjacent gate structures GS may be spaced apart from each other in the first direction X.

The gate structure GS may be disposed on the first active pattern AP1 and the second active pattern AP2. The gate structure GS may intersect the first active pattern AP1 and the second active pattern AP2.

Although the gate structure GS is shown as disposed over the first active region RX1 and the second active region RX2, this is only for convenience of explanation, and the embodiments of the present disclosure are not necessarily limited thereto. For example, a part of the gate structure GS is divided into two parts by a gate separation structure disposed on the field insulating film 105, and may be disposed on the first active region RX1 and the second active region RX2.

The gate structure GS may include, for example, a gate electrode 120, a gate insulating film 130, a gate spacer 140, and a gate capping pattern 145.

The gate electrode 120 may be disposed on the first active pattern AP1 and the second active pattern AP2. The gate electrode 120 may intersect the first active pattern AP1 and the second active pattern AP2. The gate electrode 120 may surround the first active pattern AP1 and the second active pattern AP2 protruding from the upper surface of the field insulating film 103. In an embodiment, the gate electrode 120 may include a long side extending in the second direction Y and a short side extending in the first direction X.

In an embodiment, an upper surface 120US of the gate electrode may be, but is not necessarily limited to, a concave curved surface that is recessed towards an upper surface AP1_US of the first active pattern AP1. However, in an embodiment, unlike the shown example, the upper surface 120US of the gate electrode may be a flat surface.

In an embodiment, the gate electrode 120 may include, but is not necessarily limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC) titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rb), palladium (Pd), iridium (Ir), osmium (Os), silver (Ag), gold (Au), zinc (Zn), vanadium (V), and combinations thereof.

In an embodiment, the gate electrode 120 may include conductive metal oxides, conductive metal oxynitrides and the like, and may also include oxidized forms of the aforementioned materials.

The gate electrodes 120 may be disposed on both sides (e.g., lateral sides in a first direction X) of a first source/drain pattern 150 to be described later. For example, the gate electrodes 120 may be disposed on both sides in the first direction X of the first source/drain pattern 150.

As an example, both the gate electrodes 120 disposed on both sides of the first source/drain pattern 150 may be normal gate electrodes used as the gate of the transistor. However, embodiments of the present disclosure are not necessarily limited thereto. For example, in an embodiment the gate electrode 120 disposed on one side of the first source/drain pattern 150 is used as the gate of the transistor, but the gate electrode 120 disposed on the other side of the first source/drain pattern 150 may be a dummy gate electrode.

In an embodiment, the gate electrodes 120 may be disposed on either side of a second source/drain pattern 250 to be described below. The gate structure GS may be disposed on both sides in the first direction X of the second source/drain pattern 250.

The gate spacer 140 may be disposed on the side walls of the gate electrode 120. The gate spacer 140 may extend in the second direction Y. In an embodiment, the gate spacer 140 may include, for example, at least one of silicon nitride (SiN), silicon oxynitride (SiON), silicon oxide ($SiO_2$), silicon oxycarbonitride (SiOCN), silicon boronitride (SiBiN), silicon oxyboronitride (SiOBN), silicon oxycarbide (SiOC), and combinations thereof.

The gate insulating film 130 may extend along side walls and a bottom surface of the gate electrode 120. The gate insulating film 130 may be formed on the first active pattern AP1, the second active pattern AP2 and the field insulating film 105. The gate insulating film 130 may be formed between the gate electrode 120 and the gate spacer 140.

In an embodiment, the gate insulating film 130 may be formed along the profile of the first active pattern AP1 protruding upward from the field insulating film 105 and the upper surface of the field insulating film 105. In an embodiment, an interface film may be further formed along the profile of the first active pattern AP1 protruding upward from the field insulating film 105. The gate insulating films 130 may each be formed on the interface film. In an embodiment, the gate insulating film 130 may be formed along the profile of the second active pattern AP2 protruding upward from the field insulating film 105.

In an embodiment, the gate insulating film 130 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. In an embodiment, the ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, in an embodiment the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

In an embodiment in which the ferroelectric material film includes hafnium oxide, the dopant included in the ferroelectric material film may include, for example, at least one of gadolinium (Gd), silicon (Si), zirconium (Zr), aluminum (Al), and yttrium (Y).

In an embodiment in which the dopant is aluminum (Al), the ferroelectric material film may include 3 to 8 at % (atomic %) aluminum. Here, a ratio of the dopant may be a ratio of aluminum to the sum of hafnium and aluminum.

In an embodiment in which the dopant is silicon (Si), the ferroelectric material film may include 2 to 10 at % silicon, in an embodiment in which the dopant is yttrium (Y), the ferroelectric material film may include 2 to 1.0 at % yttrium. In an embodiment in which the dopant is gadolinium (Gd), the ferroelectric material film may include 1 to 7 at % gadolinium. In an embodiment in which the dopant is zirconium (Zr), the ferroelectric material film may include 50 to 80 at % zirconium.

The paraelectric material film may have the paraelectric properties. In an embodiment, the paraelectric material film may include at least one of, for example, a silicon oxide and a metal oxide having a high dielectric constant. The metal oxide included in the paraelectric material film may include, for example, but is not necessarily limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, in an embodiment in which the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. In an embodiment, a thickness of the ferroelectric material film may be, for example, but is not necessarily limited to, 0.5 to 10 nm. Since a critical thickness that exhibits the ferroelectric properties may vary for each ferroelectric material, the thickness of the ferroelectric material film may vary depending on the ferroelectric material.

As an example, the gate insulating film 130 may include one ferroelectric material film. However, embodiments of the present disclosure are not necessarily limited thereto. For example, in an embodiment, the gate insulating, film 130 may include a plurality of ferroelectric material films spaced apart from each other. The gate insulating film 130 may have a stacked film structure in which the plurality of ferroelectric material films and the plurality of paraelectric material films are alternately stacked.

The gate capping pattern 145 may be disposed on the upper surface 120US of the gate electrode and the upper surface of the gate spacer 140. In an embodiment, the gate capping pattern 145 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

Unlike the shown example, the gate capping pattern 145 may be disposed between the gate spacers 140 (e.g., in the first direction X). In this embodiment, an upper surface of the gate capping pattern 145 may be disposed on the same plane as the upper surface of the gate spacer 140. In the semiconductor device according to some embodiments, the upper surface of the gate capping pattern 145 may be an upper surface GS_US of the gate structure.

A first source/drain pattern 150 may be disposed on the first active pattern AP1. The first source/drain pattern 150 may be disposed on the substrate 100. The first source/drain pattern 150 may be disposed on the side surface of the gate structure GS. The first source/drain pattern 150 may be disposed between the gate structures GS (e.g., in the first direction X).

The first source/drain pattern 150 may be disposed on at least one side of the gate structure GS. For example, the first source/drain pattern 150 may be disposed on both sides of the gate structure GS. Unlike the shown example, the first source/drain pattern 150 may be disposed on only one side of the gate structure GS and may not be disposed on the other side of the gate structure GS.

In an embodiment, the first source/drain pattern 150 may include an epitaxial pattern. The first source/drain pattern 150 may be included in the source/drain of a transistor that uses the first active pattern AP1 as a channel region.

The first source/drain pattern 150 may be connected to a channel pattern portion used as a channel in the first active pattern AP1. Although the first source/drain pattern 150 is shown as a merged form of three epitaxial patterns formed on each first active pattern AP1, this is merely for convenience of explanation, and embodiments of the present disclosure are not necessarily limited thereto. For example, the epitaxial patterns formed on each of the first active patterns AP1 may be separated from each other.

As an example, an air gap may be disposed in a space between the first source/drain patterns 150 merged with the field insulating films 105. In an embodiment, an insulating material may be filled in the space between the first source/drain patterns 150 merged with the field insulating film 105.

In an embodiment, a source/drain pattern as described above may be disposed on the second active pattern AP2 between the gate structures GS.

A source drain etching stop film 156 may be disposed on an upper surface of the field insulating film 105, side walls of the gate structure GS, an upper surface of the first source/drain pattern 150, and side walls of the first source/drain pattern 150. In an embodiment, the source/drain etching stop film 156 may be disposed on the upper surface of the second source/drain pattern 250 and on the side wall of the second source/drain pattern 250.

The source/drain etching stop film 156 may include a material having an etching selectivity with respect to a first interlayer insulating film 191 to be described later. In an embodiment, the source/drain etching stop film 156 may include, for example, at least one of silicon nitride (SiN), oxynitride (SiON), silicon oxycarbonitride (SiOCN), silicon boronitride (SiBN), silicon oxyboronitride (SiOBN), silicon oxycarbide (SiOC), and combinations thereof. However, embodiments of the present disclosure are not necessarily limited thereto. For example, unlike the shown example, the source/drain etching stop film 156 may not be formed.

The first source/drain contact 170 may be disposed on the first active region RX1. The second source/drain contact 270 may be disposed on the second active region RX2. The first source/drain contact 170 may be connected to the first source/drain pattern 150 formed in the first active region RX1. In an embodiment, the second source/drain contact 270 may be connected to a source/drain pattern formed in the second active region RX2.

Unlike the shown example, a part of the first source/drain contact 170 may be directly connected to a part of the second source/drain contact 270. For example, in a semiconductor device according to some embodiments, at least one or more source/drain contacts may be disposed over the first active region RX1 and the second active region RX2.

Since the contents relating to the second source/drain contact 270 are substantially the same as those relating to the first source/drain contact 170, the following description will be provided, using the first source/drain contact 170 on the first active pattern AP1 and a repeated description may be omitted for convenience of explanation.

The first source/drain contact 170 passes through the source/drain etching stop film 156 and may be connected to the first source/drain pattern 150. The first source/drain contact 170 may be disposed on the first source/drain pattern 150.

Although the first source/drain contact 170 is shown as not being in direct contact with the gate structure GS disposed on both sides, this is merely for convenience of explanation, and embodiments of the present disclosure are not necessarily limited thereto. For example, unlike the shown example, the first source/drain contact 170 may come into direct contact with at least one of the gate structure GS disposed on either side.

A silicide film 155 may be formed between the first source/drain contact 170 and the first source/drain pattern 150. Although the silicide film 155 is shown as being formed along the profile of the interface between the first source/drain pattern 150 and the first source/drain contact 170, embodiments of the present disclosure are not necessarily limited thereto. The silicide film 155 may include, for example, a metal silicide material.

The first source/drain contact 170 may include a first portion 170_1 and a second portion 170_2. The first portion 170_1 of the first source/drain contact may be directly connected to the second portion 170_2 of the first source/drain contact.

The second portion 170_2 of the first source/drain contact is a portion on which the first via plug 175 is landed (e.g., disposed thereon). In an embodiment, the first source/drain contact 170 may be connected to a wiring line 205 through the second portion 170_2 of the first source/drain contact. The first via plug 175 is not landed (e.g., disposed on) the first portion 170_1 of the first source drain contact.

For example, in the cross-sectional view as in FIGS. 2 and 6, the second portion 170_2 of the first source/drain contact may be disposed in the portion connected to (e.g., directly connected to) the first via plug 175. The first portion 170_1 of the first source/drain contact may be disposed in a portion that is not connected to (e.g., directly connected to) the first via plug 175.

Further, to prevent the gate contact 180 and the first source/drain contact 170 from coming into direct contact with each other, although the first portion 170_1 of the first source/drain contact is disposed and the second portion 170_2 of the first source/drain contact may not be disposed, on both sides of the gate structure GS of the portion connected to the gate contact 180, embodiments of the present disclosure are not necessarily limited thereto. For example, in the cross-sectional view as in FIG. 2, the first portion 170_1 of the first source/drain contact is disposed, and the second portion 170_2 of the first source/drain contact may not be disposed on both sides of the gate structure GS connected to the gate contact 180.

The upper surface of the second portion 170_2 of the first source/drain contact is higher (e.g., farther from the substrate 100 in the third direction Z) than the upper surface of the first portion 170_1, of the first source/drain contact. In FIG. 6, the upper surface of the second portion 170_2 of the first source/drain contact is higher than the upper surface of the first portion 170_1 of the first source/drain contact based on the upper surface of the field insulating film 105. For example, an upper surface 170US of the first source/drain contact may be an upper surface of the second portion 170_2 of the first source/drain contact.

In FIG. 6, although the first source/drain contact 170 is shown to have an L-shape, embodiments of the present disclosure are not necessarily limited thereto. For example, unlike the shown example, in an embodiment the first source/drain contact 170 may have a T-shape rotated by 180 degrees. In this embodiment, the first portion 170_1 of the first source/drain contact may be disposed on either side of the second portion 170_2 of the first source/drain contact.

In an embodiment, a width of the first source/drain contact 170 may increase as the distance away from the substrate 100 increases. For example, the width of the first source/drain contact 170 in the first direction X may increase as the distance from the substrate 100 increases.

For example, a height H12 from the upper surface AP1_US of the first active pattern to the upper surface 120US of the gate electrode may be greater than a height fill from the upper surface AP1_US of the first active pattern to the upper surface of the first portion of the first source/drain contact 170. In the cross-sectional view, when the upper surface 120US of the gate electrode has a concave shape, the height of the upper surface 120US of the gate electrode may be a portion closest to the upper surface AP1_US of the first active pattern.

For example, the upper surface 170US of the first source/drain contact may protrude upward (e.g., in the third direction Z) from the upper surface GS_US of the gate structure. The upper surface GS_US of the gate structure may be lower than the upper surface 170US of the first source/drain contact based on the upper surface AP1_US of the first active pattern.

In an embodiment, the first source/drain contact 170 may include a source/drain barrier film 170a and a source/drain filling film 170b on the source/drain barrier film 170a. The source drain barrier film 170a may extend along the side walls and bottom surface of the source/drain filling film 170b.

Although a bottom surface 170BS of the first source/drain contact is shown to have a wavy shape, embodiments of the present disclosure are not necessarily limited thereto. For example, in an embodiment, the bottom surface 170BS of the first source/drain contact may have a flat shape, unlike the shown example.

In an embodiment, the source/drain barrier film 170a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and two-dimensional (2D) material. In the semiconductor device according to some embodiments, the 2D material may be a metallic material and/or a semiconductor material. The 2D material may include a 2D allotrope or a 2D compound, and may include, but is not necessarily limited to, at least one of graphene, molybdenum disulfide ($MoS_2$), molybdenum diselenide ($MoSe_2$), tungsten diselenide ($WSe_2$), and tungsten disulfide ($WS_2$). For example, since the above-mentioned 2D materials are only listed by way of example, the 2D materials that may be included in the semiconductor device of the present disclosure are not necessarily limited by the above-mentioned materials.

In an embodiment, the source/drain filling film 170b may include, for example, at least one of aluminum (Al), tungsten (W), cobalt (Co), ruthenium (Ru), silver (Ag), gold (Au), manganese (Mn), and molybdenum (Mo).

The first conductive pad 160 may be disposed on the first source/drain contact 170. The first conductive pad 160 may come into direct contact with the upper surface 170US of the first source/drain contact.

The first conductive pad 160 may be disposed at a position at which the first source/drain contact 170 and the wiring line 205 are connected. For example, the first conductive pad 160 may be disposed at a position at which the first via plug 175 is formed. In an embodiment, the first conductive pad 160 may be disposed directly on an upper surface of the second portion 170_2 of the first source/drain contact and portions of lateral side walls of the first via plug 175.

The first conductive pad 160 includes an upper surface 160US and a lower surface 160BS opposite to each other in the third direction Z. The lower surface 160BS of the first conductive pad may directly contact the upper surface 170US of the first source/drain contact.

The first conductive pad 160 may include a first pad through hole 160H that penetrates the first conductive pad 160 in the third direction Z. The first pad through hole 160H may be defined by side walls 160H_SW that connect the upper surface 160US of the first conductive pad and the lower surface 160BS of the first conductive pad. For example, the width of the first pad through hole 160H may decrease as the distance from the upper surface 170US of the first source/drain contact increases.

The second conductive pad 165 may be disposed on the gate structure GS. The second conductive pad 165 may be in direct contact with the upper surface GS_US of the gate structure. For example, in an embodiment, an entirety of the lower surface of the second conductive pad 165 is disposed on the upper surface GS_US of the gate structure.

The second conductive pad 165 may be disposed at a position at which the gate electrode 120 and the wiring line 205 are connected. For example, the second conductive pad 165 may be disposed at a position at which the gate contact 180 is formed and may directly contact portions of lateral side walls of the gate contact 180.

The second conductive pad 165 includes an upper surface 165US and a lower surface 165BS opposite to each other in the third direction 2. The lower surface 165BS of the second conductive pad may directly contact with the upper surface GS_US of the gate structure. For example, the lower surface 165BS of the second conductive pad may directly contact the upper surface of the gate capping pattern 145. For example, the upper surface 165US of the second conductive pad may have a surface extending in a plane.

The lower surface 165BS of the second conductive pad may be disposed on the upper surface GS_US of the gate structure. In an embodiment, the lower surface 165BS of the second conductive pad may be higher than the upper surface GS_US of the gate structure based on the upper surface AP1_US of the first active pattern.

The second conductive pad 165 may include a second pad through hole 165H that penetrates the second conductive pad 165 in the third direction Z. The second pad through hole 165H may be defined by side walls 165H_SW that connect the upper surface 165US of the second conductive pad and the lower surface 165BS of the second conductive pad. For example, the width of the second pad through hole 165H may decrease as a distance from the upper surface 120US of the gate electrode increases.

For example, inside the gate capping pattern 145, the width of the gate contact 180 may decrease as a distance from the upper surface 120US of the gate electrode increases. However, embodiments of the present disclosure are not necessarily limited thereto. For example, unlike the shown example, in an embodiment the width of the gate contact 180 may be kept constant as a distance from the upper surface 120US of the gate electrode increases. In an embodiment, the width of the gate contact 180 may increase as a distance from the upper surface 120US of the gate electrode increases.

A thickness t1 of the first conductive pad 160 may be different from a thickness t2 of the second conductive pad 165. In the semiconductor device according to some embodiments, the thickness t2 of the second conductive pad 165 (e.g., length in the third direction Z) is greater than the thickness t1 of the first conductive pad 160 (e.g., length in the third direction Z). However, embodiments of the present disclosure are not necessarily limited thereto.

Based on the upper surface GS_US of the gate structure, the upper surface 170US of the first source/drain contact is higher than the upper surface 165US of the second conductive pad. In an embodiment, a height t2 from the upper surface GS_US of the gate structure to the upper surface 165US of the second conductive pad is less than a height H2 from the upper surface GS_US of the gate structure to the upper surface 170US of the first source/drain contact. In an embodiment, the height from the upper surface GS_US of the gate structure to the upper surface 165US of the second conductive pad is equal to the thickness of the second conductive pad 165.

Based on the upper surface GS_US of the gate structure the upper surface 160US of the first conductive pad is higher than the upper surface 165H of the second conductive pad.

The first conductive pad 160 and the second conductive pad 165 may each include a conductive material. For example, the first conductive pad 160 and the second conductive pad 165 may each include, but are not necessarily limited to, at least one of metal, metal alloy, metal nitride, metal carbide, metal carbonitride, metal oxide and a semiconductor material doped with impurities.

The first via plug 175 may be disposed on the first source/drain contact 170. The first via plug 175 is connected to the first source/drain contact 170. For example, the first via plug 175 directly contacts the upper surface 170US of the first source/drain contact.

The first via plug 175 penetrates the first conductive pad 160. The first via plug 175 passes through the first pad through hole 160H and is directly connected to the first source/drain contact 170. The first via plug 175 directly contacts the side walls 160H_SW of the first pad through hole 160H.

In an embodiment, the second via plug 275 may be disposed directly on the second source/drain contact 270. The second via plug 275 may be directly connected to the second source/drain contact 270.

Since the contents relating to the second via plug 275 are substantially the same as those relating to the first via plug 175, the following description will be provided, using the first via plug 175 on the first source/drain contact 170 and a repeated description may be omitted for convenience of explanation.

The first via plug 175 protrudes from the upper surface 160US of the first conductive pad (e.g., in the third direction Z). A portion of the first via plug 175 protrudes upward from the upper surface 160US of the first conductive pad. The remaining portion of the first via plug 175 is disposed in the first conductive pad 160 (e.g., is surrounded by the first conductive pad 160).

In at least a portion of the first via plug 175, the width of the first via plug 175 may decrease as a distance from the upper surface 170US of the first source/drain contact increases. For example, the width of the first via plug 175 may decrease as a distance from the upper surface 160US of the first conductive pad increases. A width W11 of the upper surface 75US of the first via plug is less than a width W12 of a lower surface of the first via plug 175 disposed on the upper surface 160US of the first conductive pad. In the cross-sectional view, the side wall of the first via plug 175 protruding from the upper surface 160US of the first conductive pad may have a linear shape. However, embodiments of the present disclosure are not necessarily limited thereto.

The gate contact 180 may be disposed on the gate electrode 120 (e.g., disposed directly thereon in the third direction Z). The gate contact 180 is directly connected to the gate electrode 120. The gate contact 180 comes into direct contact with the upper surface 120US of the gate electrode.

The gate contact 180 may be disposed at a position where it overlaps the gate structure GS (e.g., in the third direction Z). In the semiconductor device according to some embodiments, at least a portion of the gate contact 180 may be disposed at a position where it overlaps at least one of the first active region RX1 and the second active region RX2. For example, from the viewpoint of the plan view the gate contact 180 may be disposed at a position where it generally overlaps the first active region RX1 or the second active region RX2.

The gate contact 180 penetrates the second conductive pad 165 and the gate capping pattern 145. The gate contact 180 passes through the second pad through hole 465H and is directly connected to the gate electrode 120. The gate contact 180 comes into direct contact with the side walls 165H_SW of the second pad through hole 165H.

The gate contact 180 protrudes from the upper surface 165US of the second conductive pad (e.g., in the third direction Z). A portion of the gate contact 180 protrudes upward from the upper surface 165US of the second conductive pad. The remaining portion of the gate contact 180 is disposed inside the second conductive pad 165 and the gate structure GS (e.g., surrounded thereby).

In at least a portion of the gate contact 180, the width of the gate contact 180 may decrease as a distance from the upper surface 120US of the gate electrode increases. For example, in an embodiment the width of the gate contact 180 may decrease as a distance from the upper surface 165US of the second conductive pad increases. A width W21 of the upper surface 180US of the gate contact is less than a width W22 of the lower surface of the gate contact 180 disposed on the upper surface 165US of the second conductive pad. In the cross-sectional view, the side walls of the gate contact 180 protruding from the upper surface 165US of the second conductive pad may have a linear shape. However, embodiments of the present disclosure are not necessarily limited thereto.

In an embodiment, based on the upper surface GS_US of the gate structure, the upper surface 175US of the first via plug may be disposed on the same plane as the upper surface 180US of the gate contact. A height H31 from the upper surface GS_US of the gate structure to the upper surface 175US of the first via plug may be equal to a height H32 from the upper surface GS_US of the gate structure to the upper surface 180US of the gate contact.

In an embodiment, the first via plug 175 and the gate contact 180 may each have a single material film structure. The first via plug 175 and the gate contact 180 each may not have a multi-layer structure including different materials from each other. The first via plug 175 and the gate contact 180 may each be formed of one conductive material. In an embodiment, the first via plug 175 and the gate contact 180 may include impurities that unintentionally flow in during the process of forming the first via plug 175 and the gate contact 180.

In an embodiment, the first via plug 175 and the gate contact 180 may each be formed by a single grain. However, embodiments of the present disclosure are not necessarily limited thereto. For example, in an embodiment, the first via plug 175 and the gate contact 180 may include a plurality of crystal grains separated by grain boundary.

The first via plug 175 and the gate contact 180 may include a metal that can be selectively grown on the conductive material. In an embodiment, the first via plug 175 and the gate contact 180 may include, for example, but are not necessarily limited to, one of titanium (Ti), tungsten (W), molybdenum (Mo), ruthenium (Ru) and cobalt (Co). For example, the first via plug 175 and the gate contact 180 may include the same material.

The first interlayer insulating film 191 may be disposed on the field insulating film 105. The first conductive pad 160, the second conductive pad 165, the first source/drain contact 170, the first via plug 175, and the gate contact 180 may be disposed inside the first interlayer insulating film 191. The first interlayer insulating film 191 does not cover the upper surface 175US of the first via plug and the upper surface 180US of the gate contact.

The second interlayer insulating film 192 may be disposed on the first interlayer insulating film 191 (e.g., disposed directly thereon in the third direction Z).

In an embodiment, the first interlayer insulating film 191 and the second interlayer insulating film 192 may each include, for example, at least one of silicon oxide, silicon nitride, silicon oxynitride and a low dielectric constant material. The low dielectric constant material may include, for example, but is not necessarily limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSil Borate (TMSB), DiAcetoxyDitertiaryButoSiloxane (DADBS), TriMethylSilil Phosphate (TMSP), PolyTetraFluoroEthylene (PTFE), TOSZ (Toner SilaZen), FSG (Fluoride Silicate Glass), polyimide nanofoams such as polypropylene oxide, CDO (Carbon Doped silicon Oxide), CSG (Organo Silicate Glass), SiLK Amorphous Fluorinated Carbon, silica aerogels, silica xerogels, mesoporous silica or combinations thereof.

The wiring line 205 may be disposed inside the second interlayer insulating film 192. The wiring line 205 is directly connected to the first via plug 175. The wiring line 205 may come into direct contact with the first via plug 175. The wiring line 205 is directly connected to the gate contact 180. The wiring line 205 may be in direct contact with the gate contact 180. In an embodiment, the second via plug 275 is directly connected to the wiring line 205.

The wiring line 205 may include a wiring, barrier film 205a and a wiring filling film 205b. The wiring barrier film 205a may extend along the upper surface of the second interlayer insulating film 192, the upper surface 175US of the first via plug, and the upper surface 180US of the gate contact. The wiring filling film 205b may be disposed on the wiring barrier film 205a (e.g., disposed directly thereon).

In an embodiment, the wiring barrier film 205a may include, for example, at least, one of tantalum (Ta), tantalum nitride (TaN), titanium (Ti), titanium nitride (TiN), titanium silicon nitride (TiSiN), ruthenium (Rh), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material. The wiring filling, film 205b may include, for example, at least one of aluminum (Al), copper (Cu), tungsten (W), cobalt (Co), ruthenium (Ru), silver (Ag), gold (Au), manganese (Mn), and molybdenum (Mo). However, embodiments of the present disclosure are not necessarily limited thereto.

FIGS. 7 to 10 are diagrams for explaining a semiconductor device according to some embodiments. For convenience of explanation, points different from those described using FIGS. 1 to 6 will be mainly described and a description of similar or identical elements may be omitted.

For reference, FIGS. 7 to 10 are enlarged views of a portion P of FIG. 2. In some embodiments, the contents described in FIGS. 7 to 10 may also be applied between the gate contact 180 and the second conductive pad 165.

Figure 7:
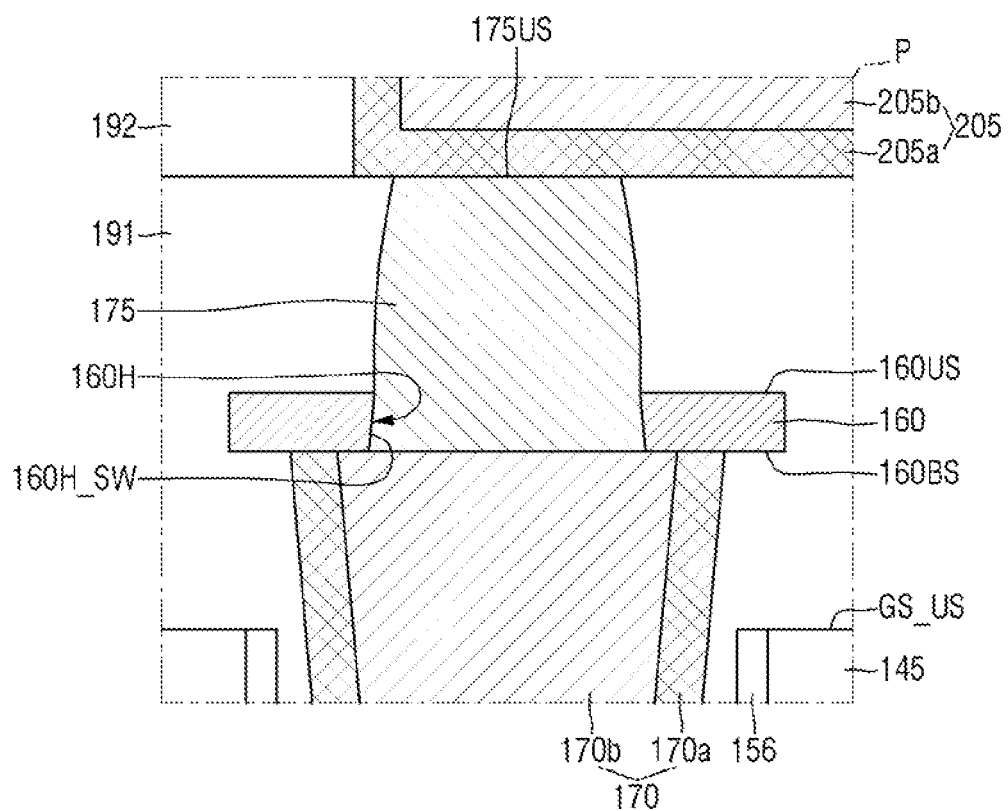
FIGS. 7 to 10 are enlarged cross-sectional views of a semiconductor device showing, a portion P of FIG. 2 according to some embodiments of the present disclosure.

Referring to FIG. 7, in the semiconductor device according to some embodiments, the side walls of the first via plug 175 protruding from the upper surface 160US of the first conductive pad may have a curved shape.

For example, a rate at which the width of the first via plug 175 increases may change as a distance from the upper surface 160US of the first conductive pad increases.

Figure 8:
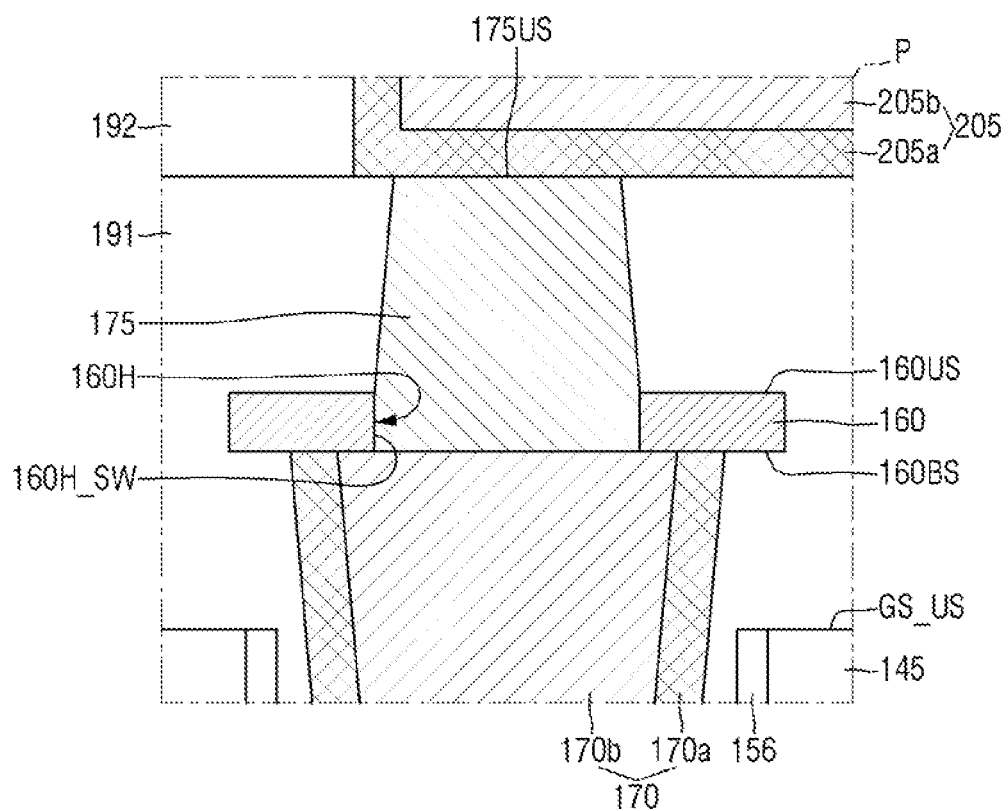

Referring to FIG. 8, in the semiconductor device according to some embodiments, the width of the first pad through hole 160H may be constant. In an embodiment, the side walls of the first via plug 175 protruding from the upper surface 160US of the first conductive pad may have a linear shape that decreases as a distance from the upper surface 160US of the first conductive pad increases.

The width of the first pad through hole 160H may be kept constant as a distance from the upper surface 170US of the first source/drain contact increases.

Figure 9:
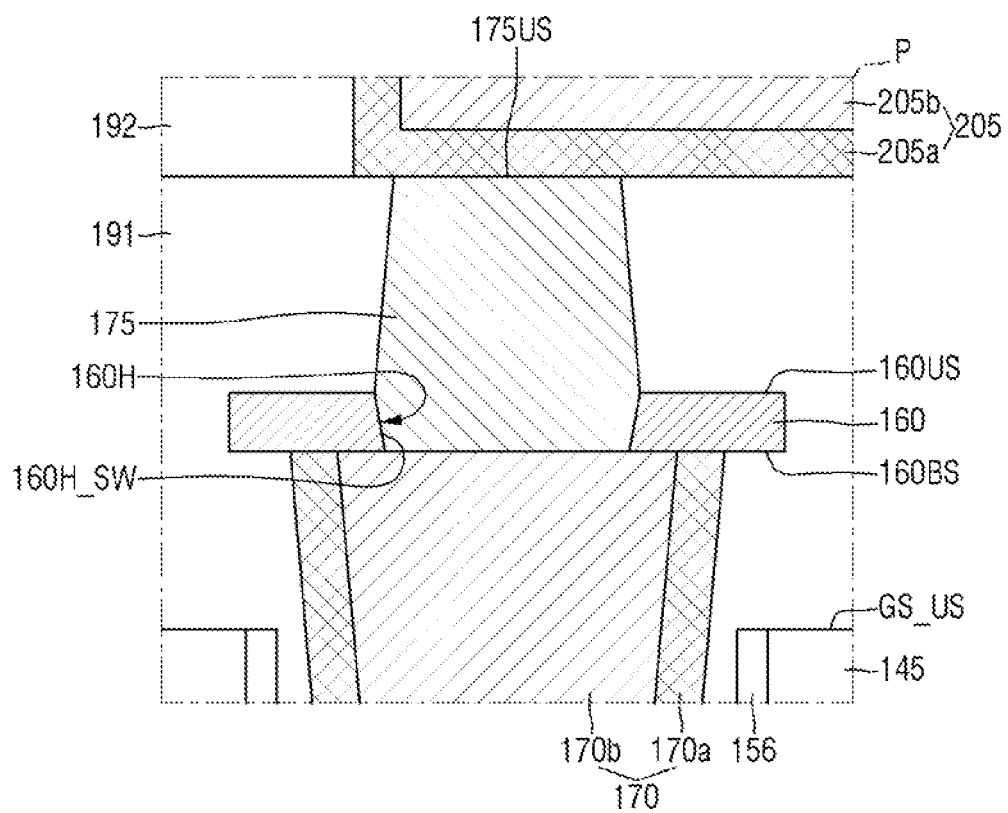

Referring to FIG. 9, in the semiconductor device according to some embodiments, the width of the first pad through hole 160H may increase a distance from the upper surface 120US of the gate electrode increases.

As a distance from the upper surface 170US of the first source/drain contact increases, the width of the first via plug 175 increases. The width of the first via plug 175 may then decrease as a distance from the upper surface 160US of the first conductive pad increases.

Figure 10:
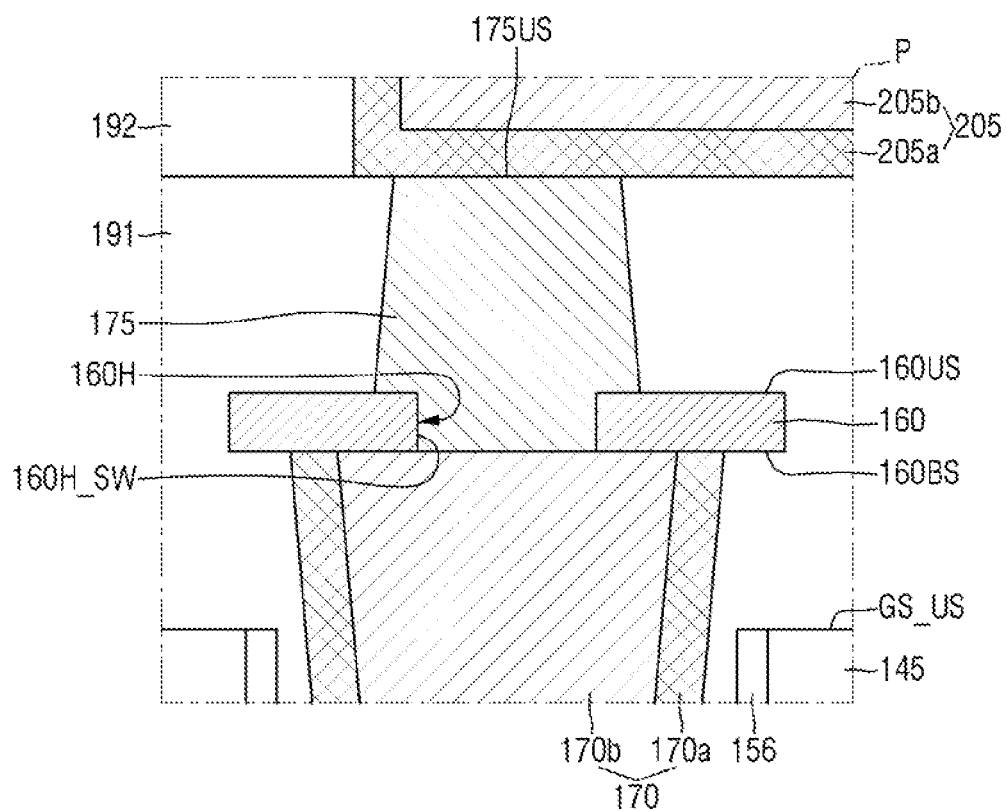

Referring to FIG. 10, in a semiconductor device according to some embodiments, the first via plug 175 may cover a portion of the upper surface 160US of the first conductive pad.

The width of the first via plug 175 may vary discontinuously based on the upper surface 160US of the first conductive pad. It is assumed that the first via plug 175 includes a first portion disposed in the first conductive pad 160, and a second portion protruding from the upper surface 160US of the first conductive pad. The width of the first portion of the first via plug 175 on the upper surface 170US of the first source/drain contact is less than the width of the first portion of the first via plug 175 on the upper surface 160US of the first conductive pad.

Figure 11:
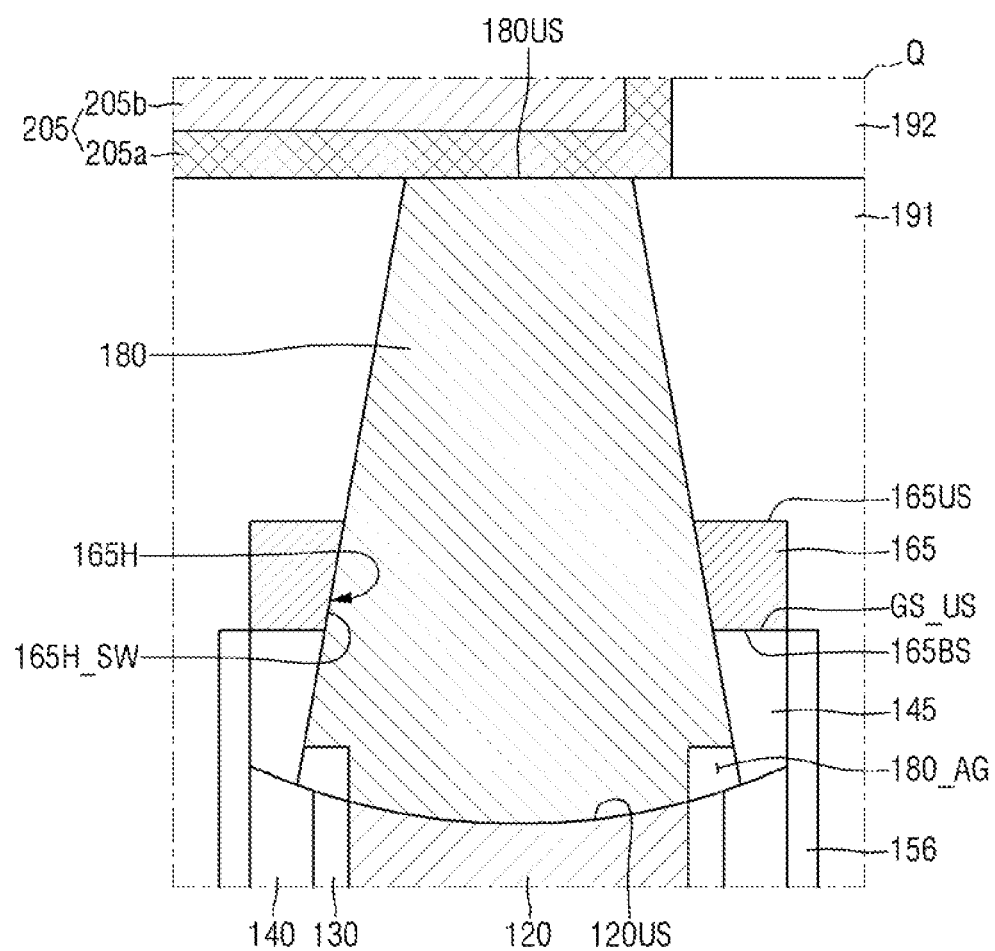
FIGS. 11 and 12 are enlarged cross-sectional views of a semiconductor device showing a portion Q of FIG. 2 according to some embodiments of the present disclosure.
Figure 12:
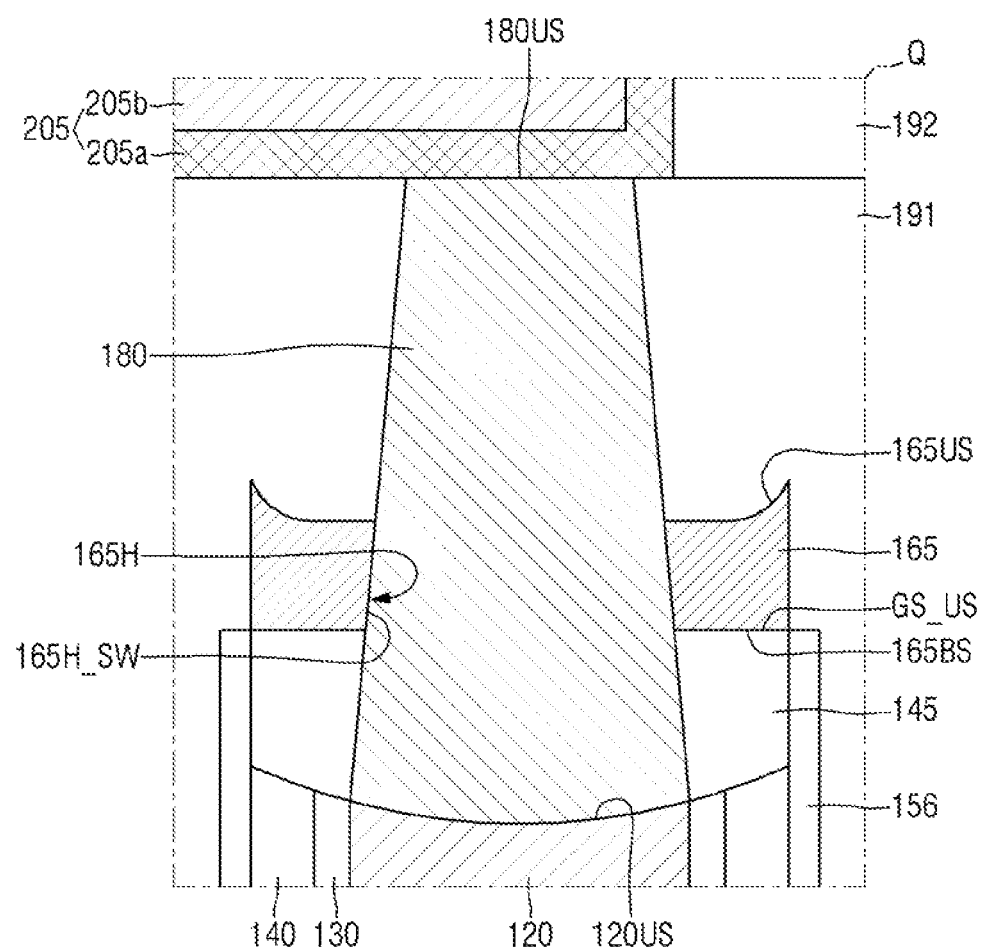

FIGS. 11 and 12 are diagrams for explaining a semiconductor device according to some embodiments, respectively. For convenience of explanation, points different from those described using FIGS. 1 to 6 will be mainly described and a repeated description of similar or identical elements may be omitted.

For reference, FIGS. 11 and 12 are enlarged views of a portion Q of FIG. 2, respectively.

Referring to FIG. 11, the semiconductor device according to some embodiments may include an insertion air gap 180_AG disposed at the bottom of the gate contact 180.

The gate contact 180 may be disposed inside the gate contact hole formed over the first interlayer insulating film 191, the second conductive pad 165 and the gate capping pattern 145. The gate contact hole may expose not only the gate electrode 120 but also the gate insulating film 130 and the gate spacer 140. However, embodiments of the present disclosure are not necessarily limited thereto. For example, unlike the shown example, the gate contact hole may not expose the gate spacer 140.

Although it will be described in a manufacturing method, the gate contact 180 may be formed only on the conductive material through a selective growth method. For example, the gate contact 180 may not be grown on the gate insulating film 130 and the gate spacer 140 that are the insulating materials. The insertion air gap 180_AG may be formed by such a method for forming the gate contact 180.

Referring to FIG. 12, in the semiconductor device according to some embodiments, the upper surface 165US of the second conductive pad may include a curved surface.

The upper surface 165US of the second conductive pad may include a concave curved surface, that is recessed toward the upper surface 120US of the gate electrode.

Figure 13:
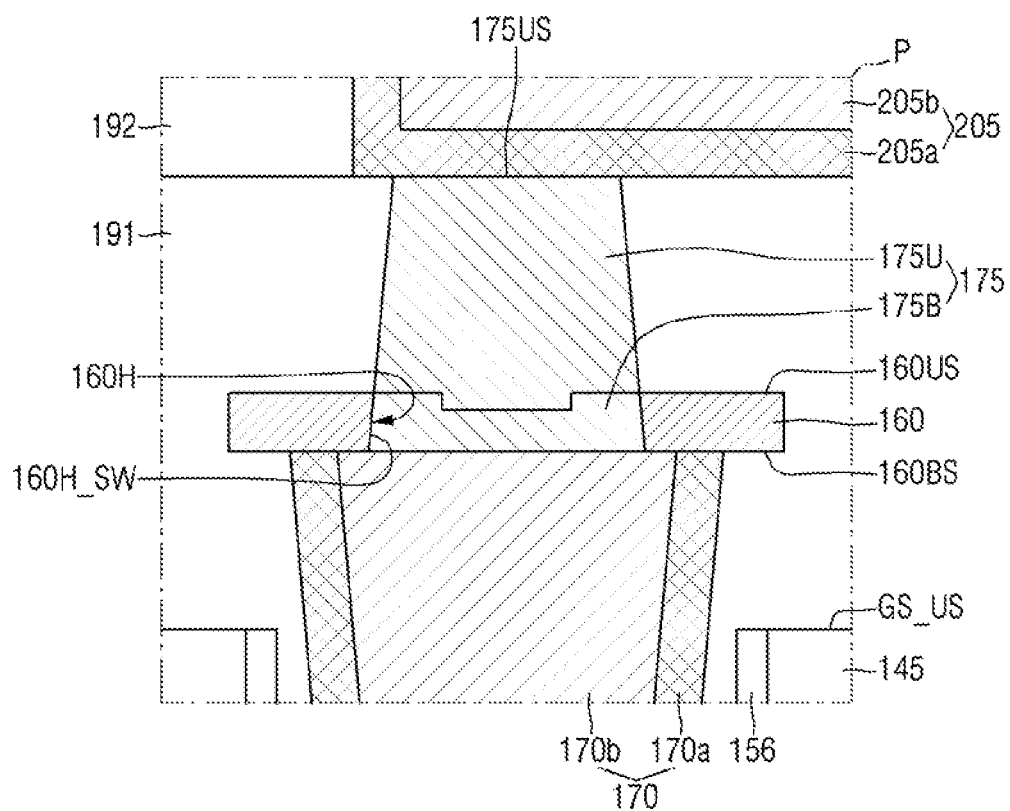
FIGS. 13 and 14 are enlarged cross-sectional views of a semiconductor device showing portions P and Q of FIG. 2, respectively, according to some embodiments of the present disclosure.
Figure 14:
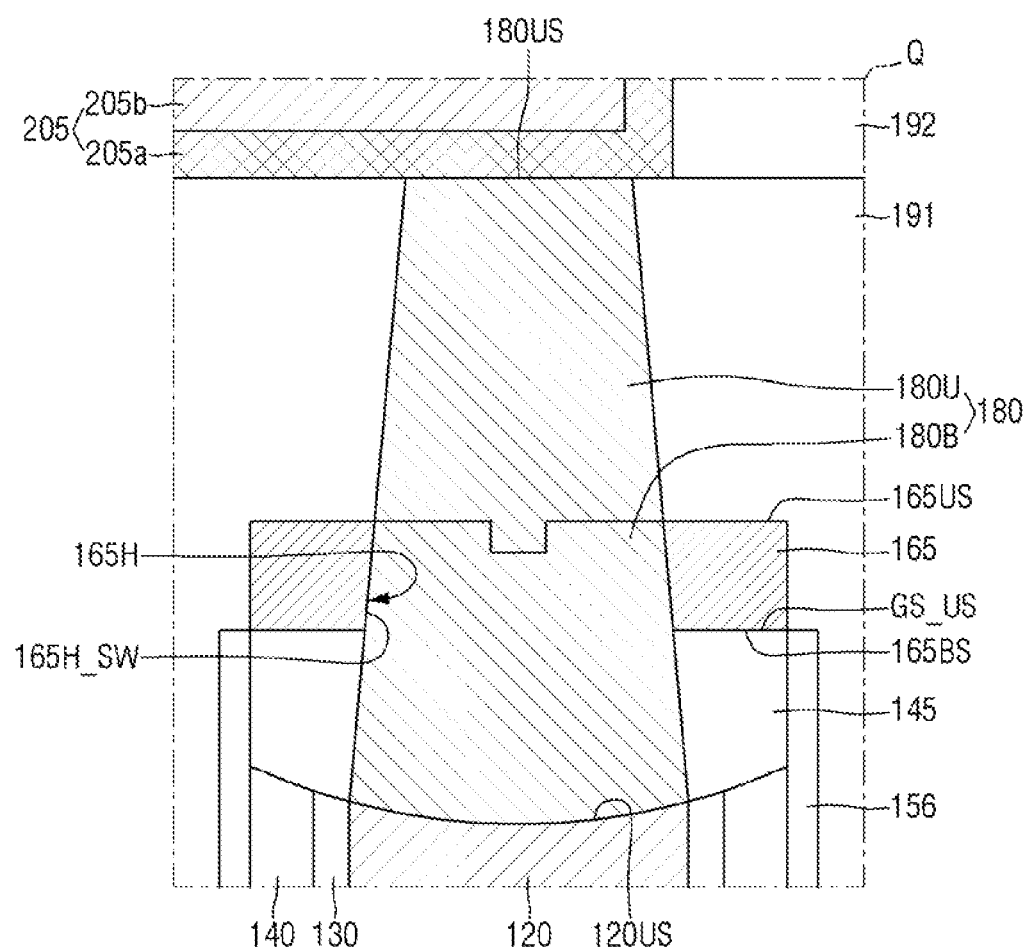

FIGS. 13 and 14 are diagrams for explaining a semiconductor device according to some embodiments. For convenience of explanation, points different from those described using FIGS. 1 to 6 will be mainly described and a repeated description of similar or identical elements may be omitted.

For reference, FIG. 13 is an enlarged view of a portion P of FIG. 2, and FIG. 14 is an enlarged view of a portion Q of FIG. 2.

Referring to FIGS. 13 and 14, in the semiconductor device according to some embodiments, the first via plug 175 may include a lower via plug 175B and an upper via plug 175U. The gate contact 180 may include a lower gate contact 180B and an upper gate contact 180U.

The upper, via plug 175U is disposed on the lower via plug 175B (e.g., disposed directly thereon in the third direction D3). The upper via plug 175U is directly connected to the lower via plug 175B.

The lower via plug 175B is directly connected to and directly contacts the first source/drain contact 170. The lower via plug 175B is disposed in the first conductive pad 160. For example, the lower via plug 175B may be disposed inside the first conductive pad 160 and is surrounded by the first conductive pad 160. The lower via plug 175B directly contacts the side walls 160H_SW of the first pad through hole 160H.

The upper via plug 175U may protrude upward from the upper surface 160US of the first conductive pad. A portion of the first via plug 175 that protrudes from the upper surface 160H_SW of the first conductive pad may be the upper via plug 175U. The upper via plug 175U may not directly contact the side walls 160H_SW of the first pad through hole 160H.

In an embodiment, a portion of the upper via plug 175U may enter the first pad through hole 160H. For example, a lowermost portion of the upper via plug 175U may be coplanar (e.g., in the third direction Z) with a portion of the lower via plug 175B and may be disposed at a central portion of the first pad through hole 160H so that the co-planar portion of the lower via plug 175B is disposed between the lowermost portion of the upper via plug 175U and side walls 160H_SW of the first pad through hole 160H (e.g., in the first direction X). However, embodiments of the present disclosure are not necessarily limited thereto. For example, unlike the shown example, the upper via plug 175U may not enter the first pad through hole 160H.

In an embodiment, the width of the upper via plug 175U may decrease as a distance from the upper surface 170US of the first source/drain contact increases. For example, the width of the upper via plug 175U may decrease as a distance from the tipper surface 160US of the first conductive pad increases. The upper surface of the upper via plug 175U is the upper surface 175US of the first via plug. The width of the upper surface of the upper via plug 175U is less than the width of the first via plug 175 on the upper surface 160US of the first conductive pad.

The upper gate contact 180U is disposed on the lower gate contact 180B (e.g., disposed directly thereon in the third direction Z). The upper gate contact 180U is directly connected to the lower gate contact 180B.

The lower gate contact 180B is directly connected to and directly contacts the gate electrode 120. The lower gate contact 180B is disposed inside the second conductive pad 165 and the gate capping pattern 145. The lower gate contact 180B directly contacts the side walls 165H_SW of the second pad through hole 165H.

The upper gate contact 180U may protrude upward from the upper surface 165US of the second conductive pad (e.g., in the third direction Z). A portion of the gate contact 180 that protrudes from the upper surface 165US of the second conductive pad may be the upper gate contact 180U. Me upper, gate contact 180U may not directly contact the side walls 165H_SW of the second pad through hole 165H.

A portion of the upper gate contact 180U may be recessed into the second pad through hole 165H. For example, a lowermost portion of the upper gate contact 180U may be coplanar (e.g., in the third direction Z) with a portion of the lower gate contact 180B and may be disposed at a central portion of the second pad through hole 165H so that the co-planar portion of the lower gate contact 180B is disposed between the lowermost portion of the upper gate contact 180U and side walls 165H_SW of the second pad through hole 165H (e.g., in the first direction X). However, embodiments of the present disclosure are not necessarily limited thereto. For example, unlike the shown example, the upper gate contact 180U may not be recessed into the second pad through hole 165H.

The width of the upper gate contact 180U may decrease as a distance from the upper surface 120US of the gate electrode increases. For example, the width of the upper gate contact 180U may decrease as a distance from the upper surface 165US of the second conductive pad increases. The upper surface of the upper gate contact 180U is the upper surface 180US of the gate contact. The width of the upper surface of the upper gate contact 180U is less than the width of the gate contact 180 on the upper surface 165US of the second conductive pad.

In an embodiment, the lower via plug 175B and the lower gate contact 180B may each have a single material film structure. The lower via plug 175U and the lower gate contact 180U may include the same material.

In an embodiment, the upper via plug 175U and the upper gate contact 180U may each have a single material film structure. The upper via plug 175U and the upper gate contact 180U may include the same material.

In an embodiment, the lower via plug 175B, the lower gate contact 180B, the upper via plug 175U and the upper gate contact 180U may include a metal that can be selectively grown on the conductive material. The lower via plug 175B and the lower gate contact 180B may include, for example, but are not necessarily limited to, one of titanium (Ti), tungsten (W), molybdenum (Mo), ruthenium (Ru), and cobalt (Co). The upper via ping 175U and the upper gate contact 180U may include, for example, but are not necessarily limited to, one of titanium (Ti), tungsten (W), molybdenum (Mu), ruthenium (Ru) and cobalt (Co).

Hereinafter, the first via plug 175 will be described as for example. In some embodiments, the description may also be applied to the gate contact 180.

In an embodiment, the lower via plug 175B may include the same material as the upper via plug 175U. The lower via plug 175B and the upper via plug 175U may be formed by a single grain. However, a priority growth direction of the lower via plug 175B may be different from a priority growth direction of the upper via plug 175U. The lower via plug 175B and the upper via plug 175U may be distinguished through a difference in the growth direction between the lower via plug 175B and the upper via plug 175U.

In another example, the lower via plug 175B may include the same material as the upper via plug 175U. One of the lower via plug 175B and the upper via plug 175U may be formed by a single grain. The other of the lower via plug 175B and the upper via plug 175U may be formed by a plurality of crystal grains. The lower via plug 175B and the upper via plug 175U may be distinguished through a difference in crystal grains between the lower via plug 175B and the upper via plug 175U.

In still another example, the lower via plug 175B includes a material different from the upper via plug 175U. The lower via plug 175B and the upper via plug 175U may be distinguished through the material difference.

Figure 15:
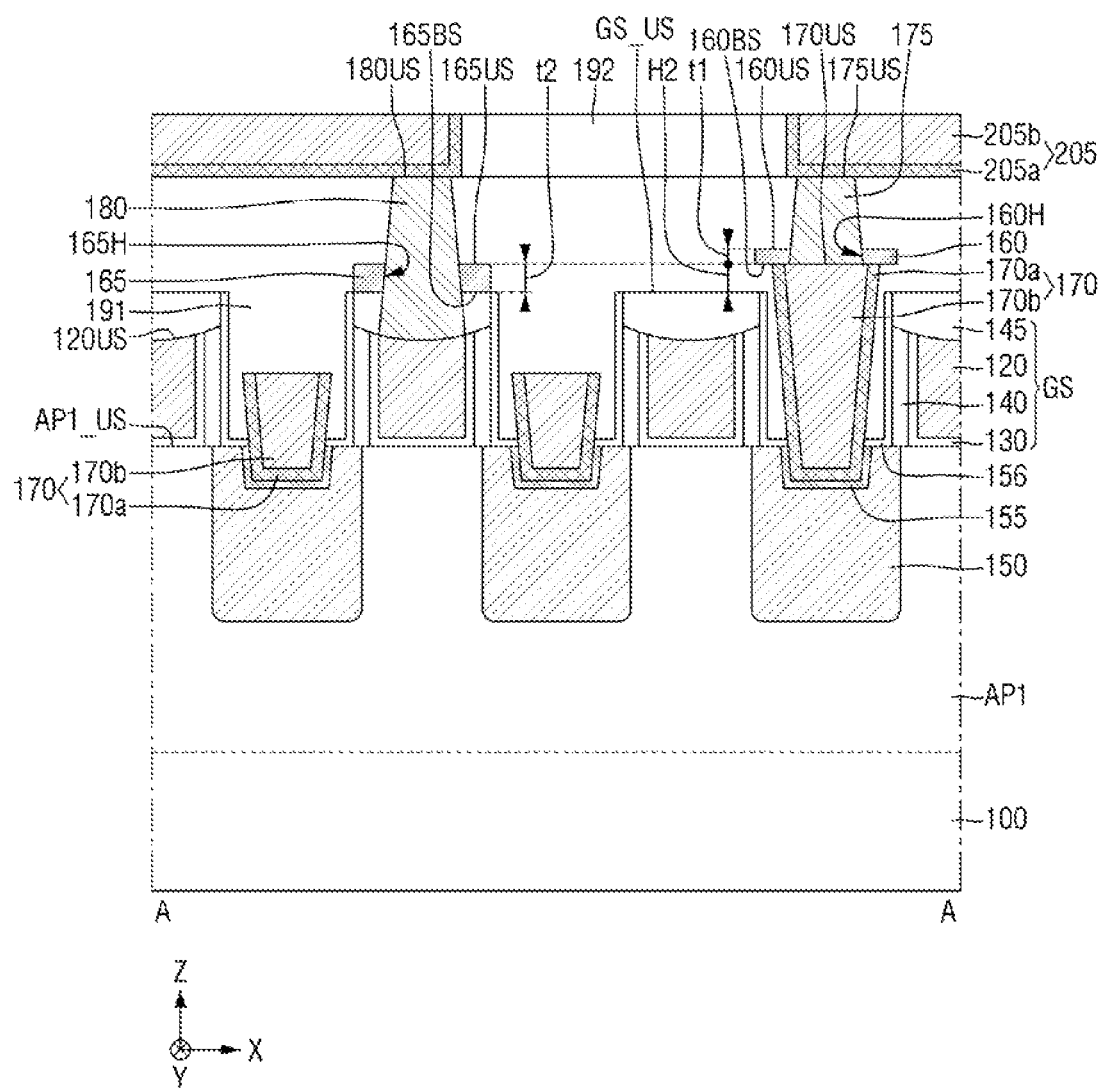
FIGS. 15 and 16 are cross-sectional views of a semiconductor device taken along line A-A of FIG. 1 according to some embodiments of the present disclosure.
Figure 16:
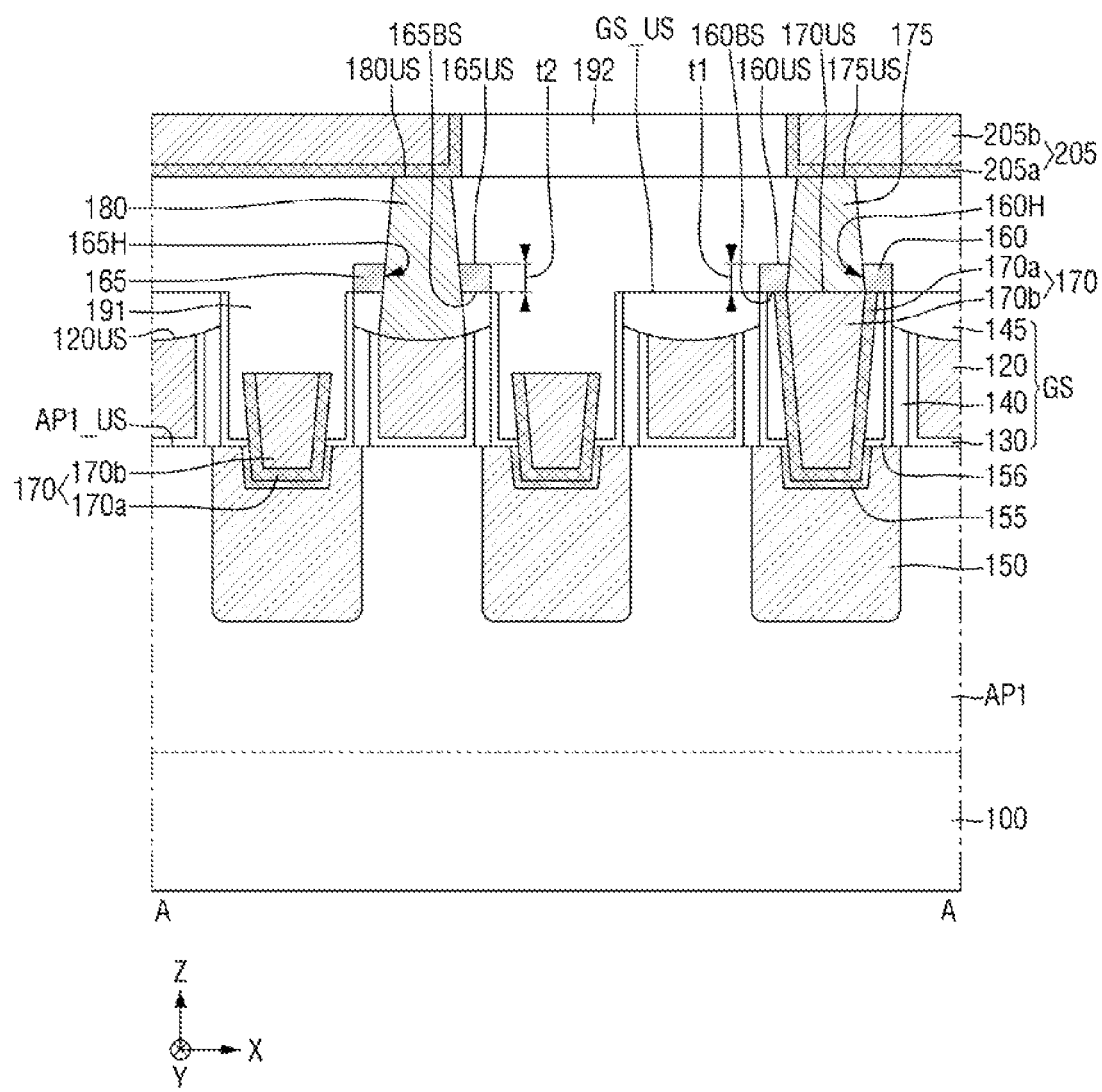

FIGS. 15 and 16 are diagrams for explaining a semiconductor device according to some embodiments, respectively. For convenience of explanation, points different from those described using FIGS. 1 to 6 will be mainly described and a repeated description of similar or identical elements may be omitted.

Referring to FIG. 15, in a semiconductor device according to some embodiments, the upper surface 170US of the first source/drain contact may be disposed on the same plane as the upper surface 165US of the second conductive pad.

Based on the upper surface GS_US of the gate structure, the upper surface 170US of the first source/drain contact may be disposed at the same height level as that of the upper surface 165US of the second conductive pad.

A height t2 from the upper surface GS_US of the gate structure to the upper surface 165US of the second conductive pad may be the same as (e.g., equal to) a height H2 from the upper surface GS_US of the gate structure to the upper surface 170US of the first source/drain contact.

Referring to FIG. 16, in the semiconductor device according to some embodiments, the upper surface GS_US of the gate structure may be disposed on the same plane as the upper surface 170US of the first source/drain contact. For example, the upper surface GS_US of the gate structure may be coplanar with the upper surface 170US of the first source/drain contact in the third direction Z.

Based on the upper surface AP1_US of the first active pattern, the upper surface GS_US of the gate structure may be disposed at the same height level as that of the upper surface 170US of the first source/drain contact.

For example, in contrast to an embodiment shown in FIG. 2, the thickness t2 of the second conductive pad 165 may be equal to the thickness t1 of the first conductive pad 160.

Figure 17:
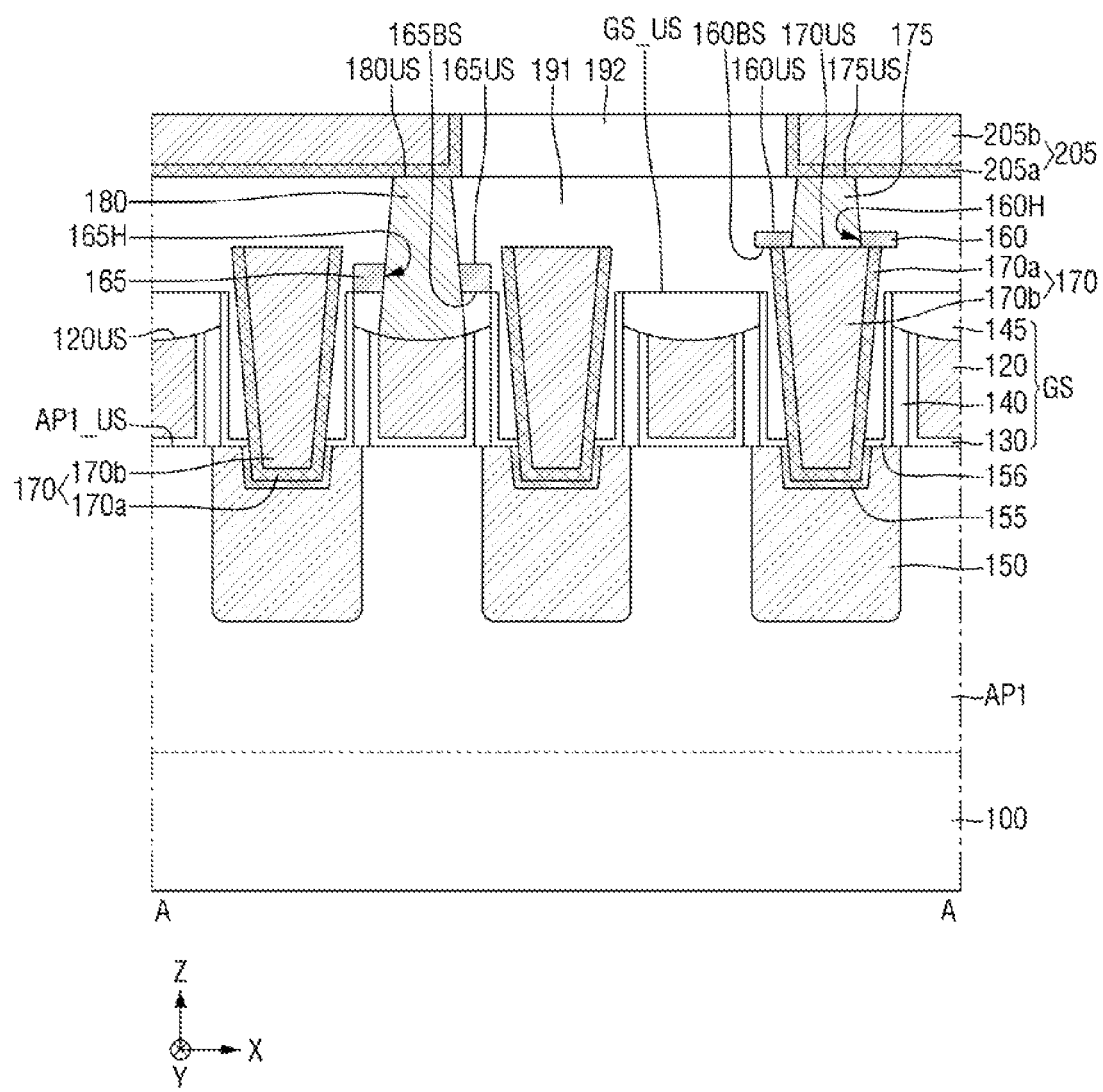
FIGS. 17 to 19 are cross-sectional views of a semiconductor device taken along line A-A of FIG. 1 according to some embodiments of the present disclosure.
Figure 18:
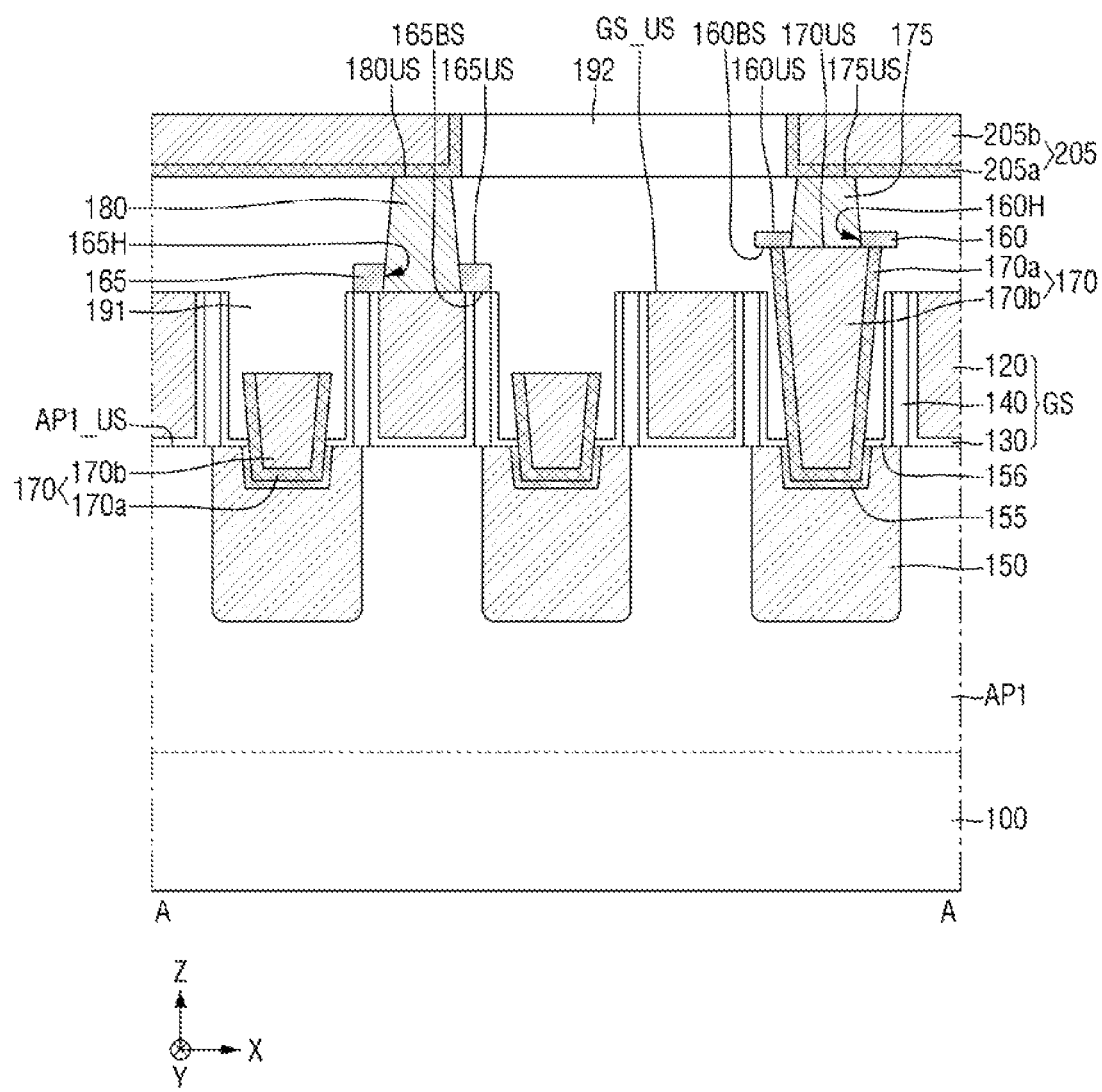
Figure 19:
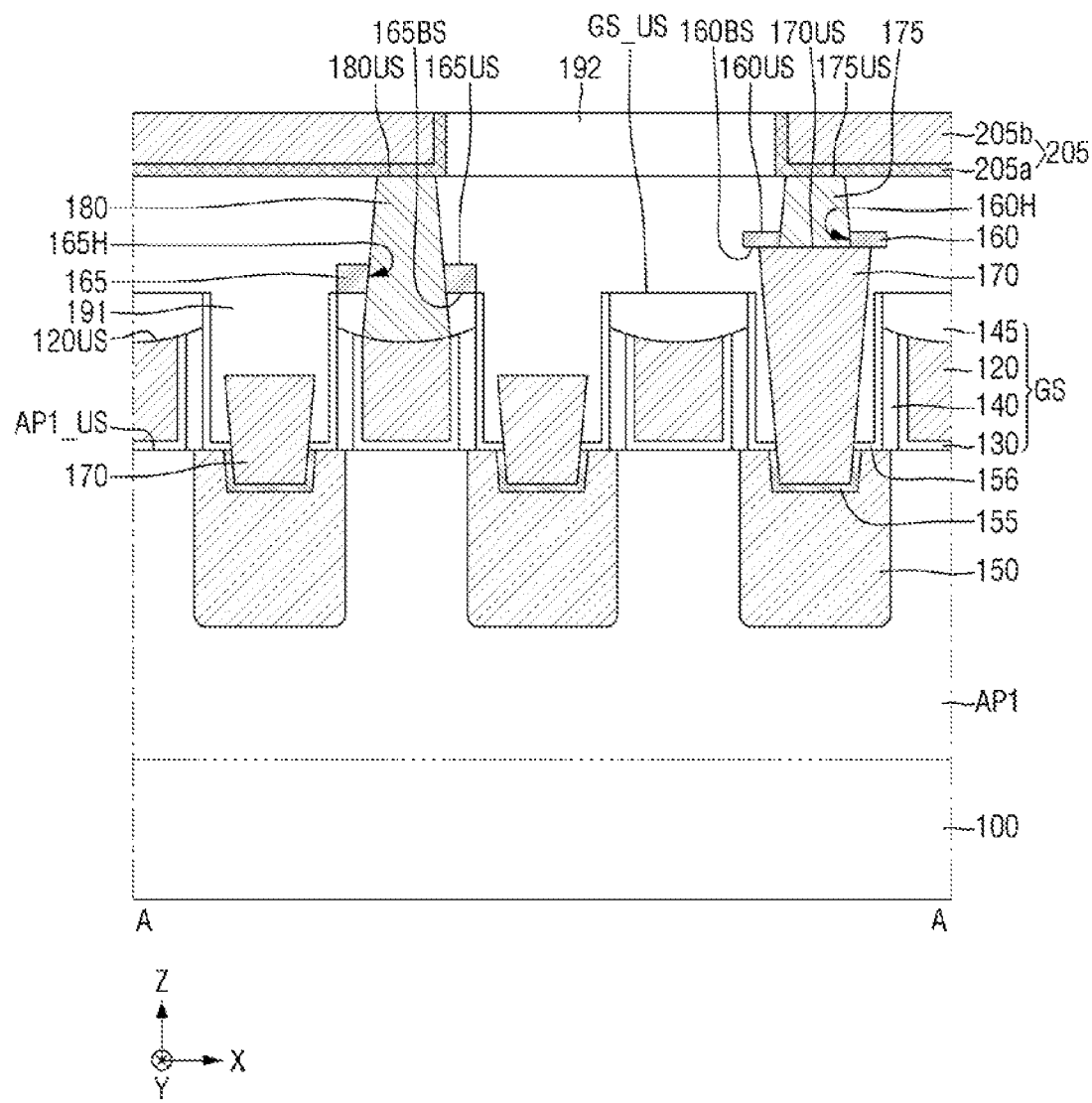

FIGS. 17 to 19 are diagrams for explaining a semiconductor device according to some embodiments. For convenience of explanation, points different from those described using FIGS. 1 to 6 will be mainly described and a repeated description of similar or identical elements may be omitted.

Referring to FIG. 17, in the semiconductor device according to some embodiments, the height of the first source/drain contact 170 may be constant based on the upper surface AP1_US of the first active pattern, irrespective of landing of the first via plug 175.

In an embodiment in which the first source/drain contact 170 includes a first portion (170_1 of FIG. 6) on which the first via plug 175 is not landed and a second portion (170_2 of FIG. 6) on which the first via plug 175 is landed, the height of the upper surface of the second portion of the source/drain contact 170 may be the same as the height of the upper surface of the first portion of the first source/drain contact 170.

Referring to FIG. 18, in the semiconductor device according to some embodiments, the upper surface GS_US of the gate structure includes the upper surface of the gate electrode 120.

The gate structure GS may not include the gate capping pattern (145 of FIG. 2). The second conductive pad 165 may be in direct contact with at least one of the gate insulating film 130 and the gate electrode 120.

Referring to FIG. 19, in the semiconductor device according to some embodiments, the first source/drain contact 170 does not have a multi-film structure including different materials from each other.

The first source/drain contact 170 may have, for example, a single material film structure.

Figure 20:
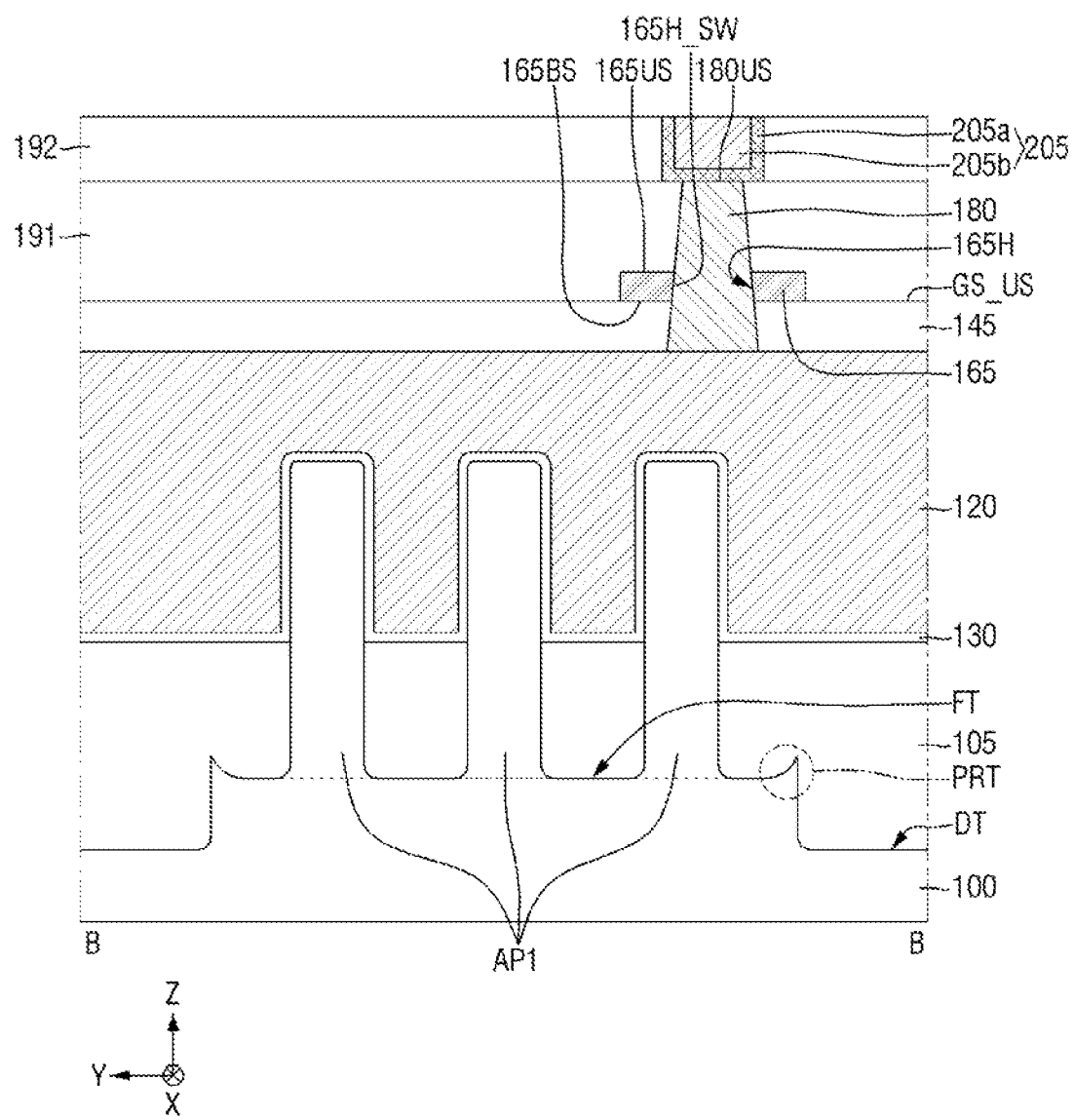
FIGS. 20 to 22 are cross-sectional views of a semiconductor device taken along line B-B of FIG. 1 according to some embodiments of the present disclosure.
Figure 21:
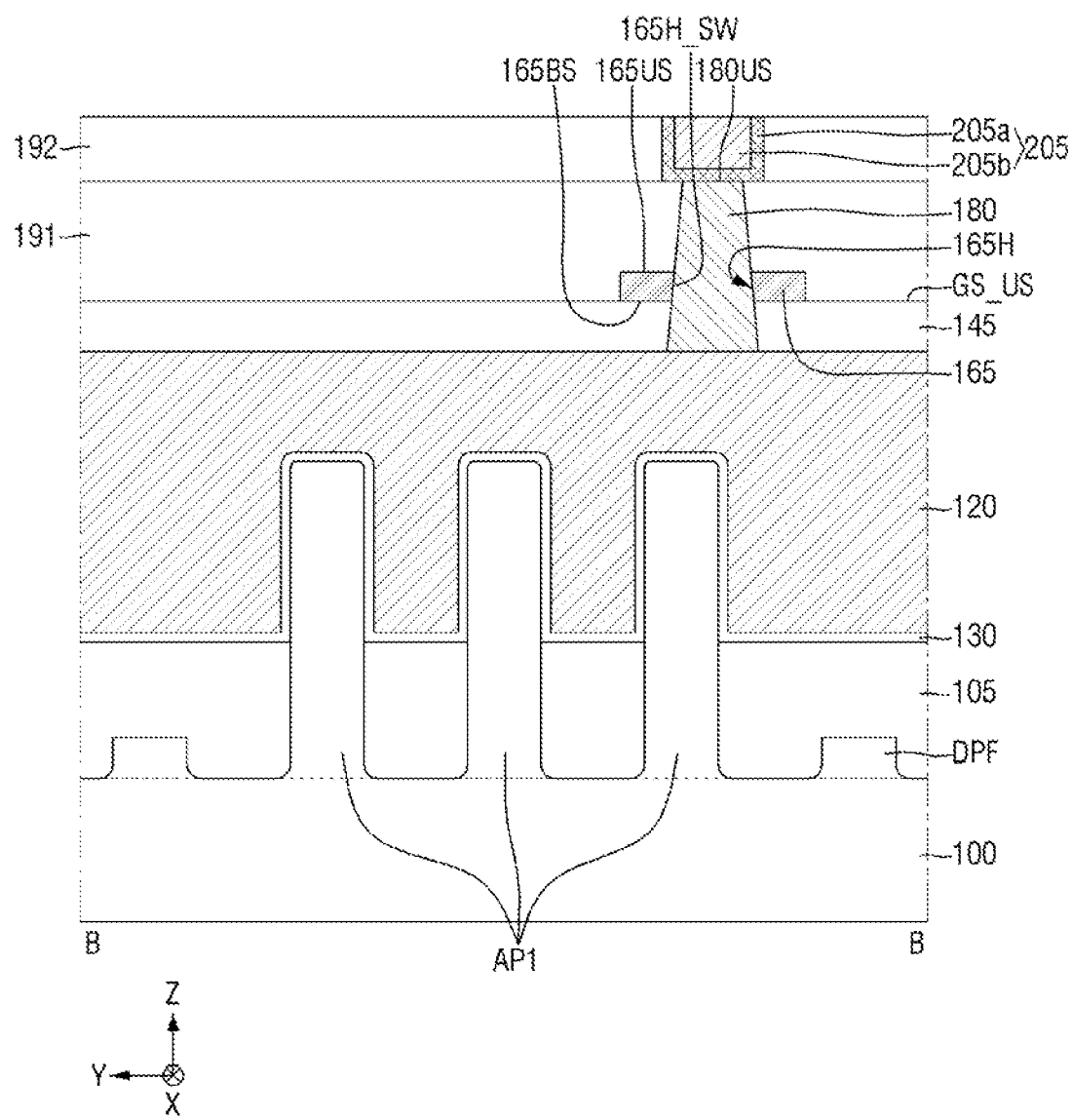
Figure 22:
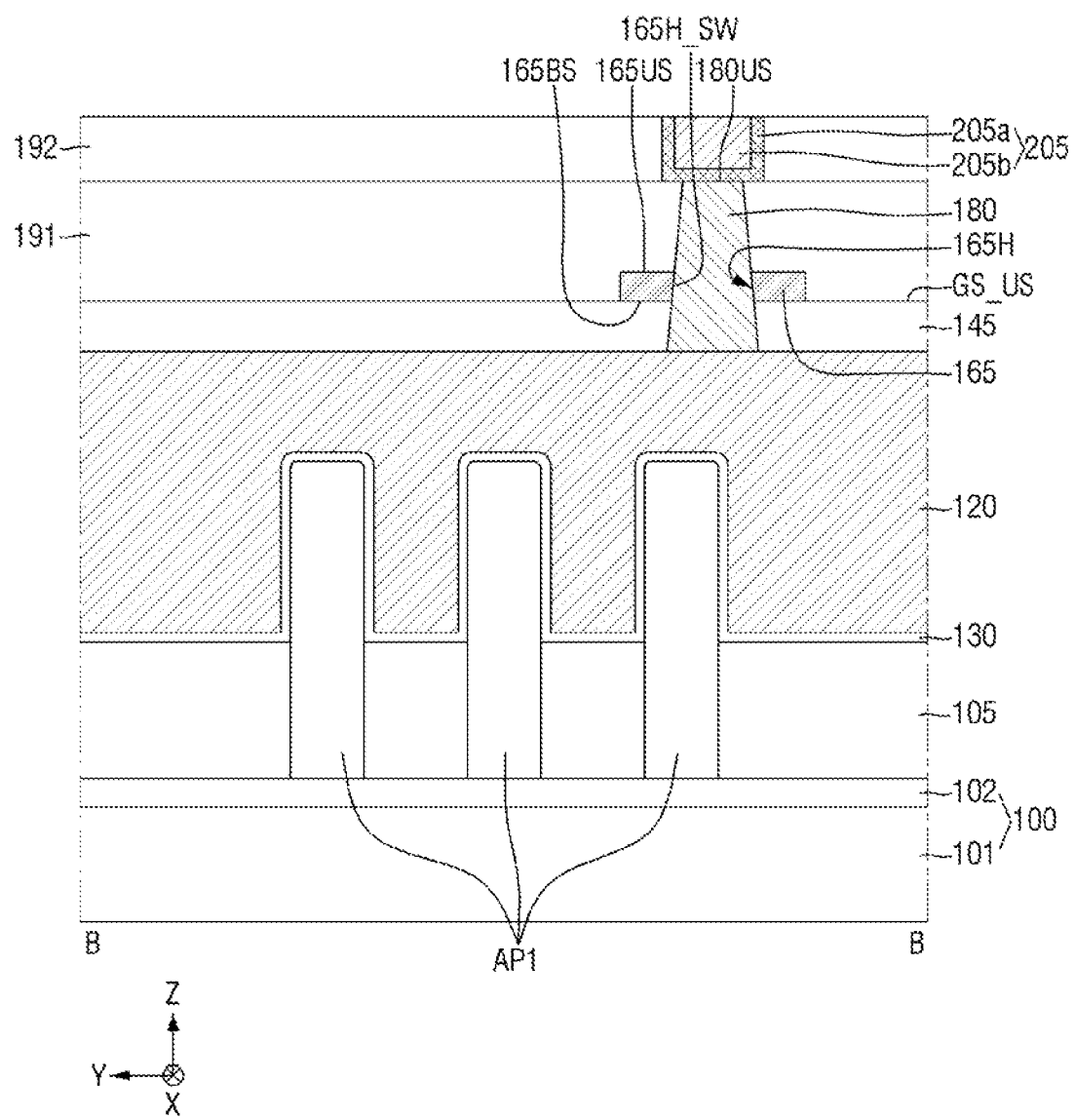

FIGS. 20 to 22 are diagrams for explaining a semiconductor device according to some embodiments. For convenience of explanation, points different from those described using FIGS. 1 to 6 will be mainly described and a repeated description of similar or identical elements may be omitted.

Referring to FIG. 20, the semiconductor device according to some embodiments may further include a protruding structure PRT disposed along the boundary of the first active region RX1.

The protruding structure PRT may be disposed at the boundary of the first active region RX1 extending along the first direction X. A first side wall of the protruding structure PRT may be defined by a tin trench FT, and a second side wall of the protruding structure PRT may be defined by a deep trench DT. The protruding structure PRT may extend in the first direction X.

The protruding structure PRT is covered with a field insulating film 105. The protruding structure PRT may include the same semiconductor material as the first active pattern AP1.

Although the protruding structure PRT is shown as being disposed along the two boundaries of the first active region RX1 extending along the first direction X, the embodiments of the present disclosure are not necessarily limited thereto. For example, unlike the shown example, the protruding structure PRT may be disposed along only one of the two boundaries of the first active region RX1 extending along the first direction X.

In an embodiment, the protruding structure PRT may also be disposed at the edge of the second active region RX2, such as at least one of the two boundaries of the second active region RX2 extending along the first direction X.

Referring to FIG. 21, the semiconductor device according to some embodiments may include a dummy protruding pattern DFP formed in the field region FX.

A deep trench (DT of FIG. 2) may not be formed M the field region FX. The upper surface of the dummy protrusion pattern DFP is covered with the field insulating film 105.

Referring to FIG. 22, in the semiconductor device according to some embodiments, the substrate 100 may include a base substrate 101 and a buried insulating film 102 on the base substrate 101.

In an embodiment, the base substrate 101 may include, but is not necessarily limited to, a semiconductor material. The buried insulating film 102 may be formed generally along the upper surface of the base substrate 101. The buried insulating film 102 may include an insulating material.

Figure 23:
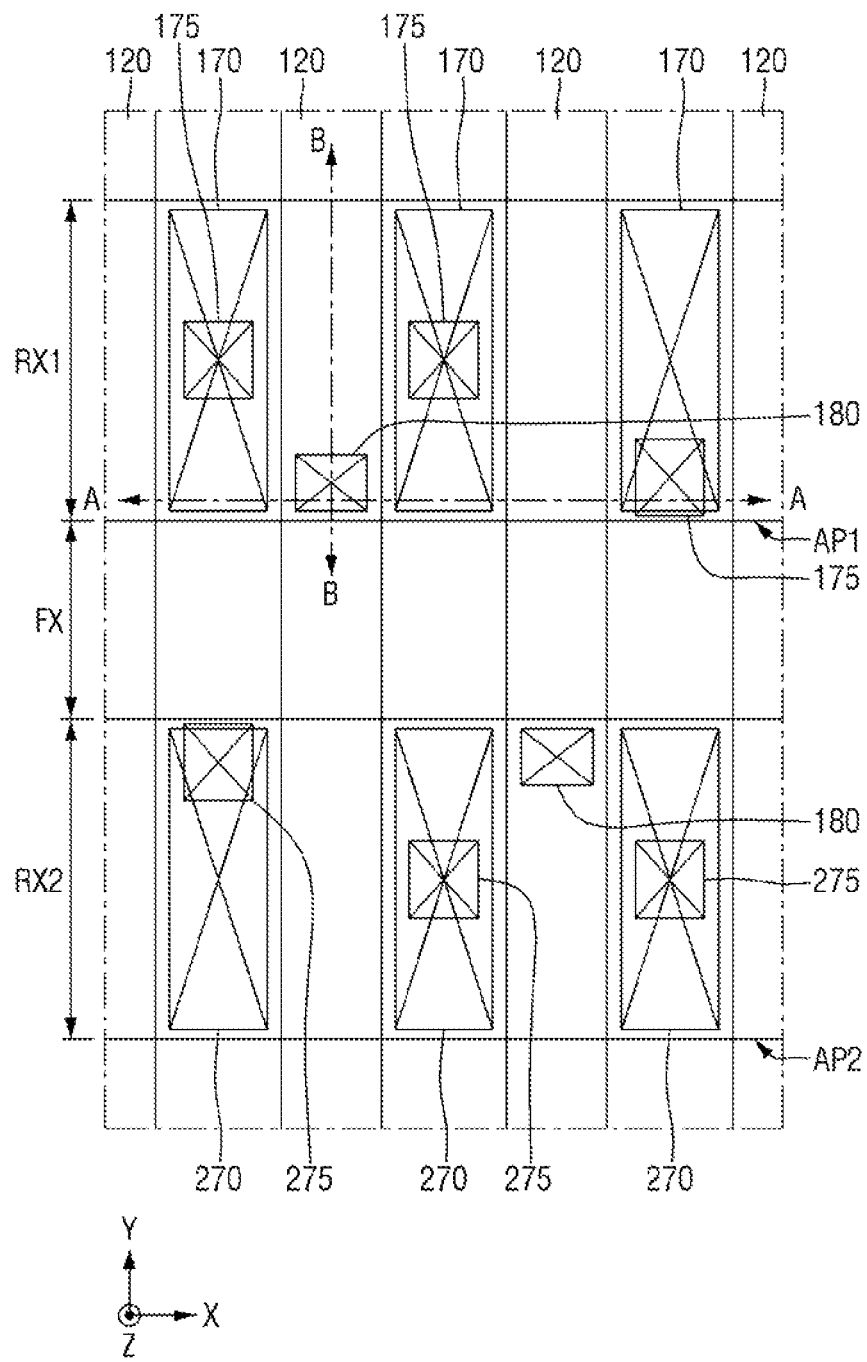
FIG. 23 is a layout diagram of a semiconductor device according to embodiment of the present disclosure.
Figure 24:
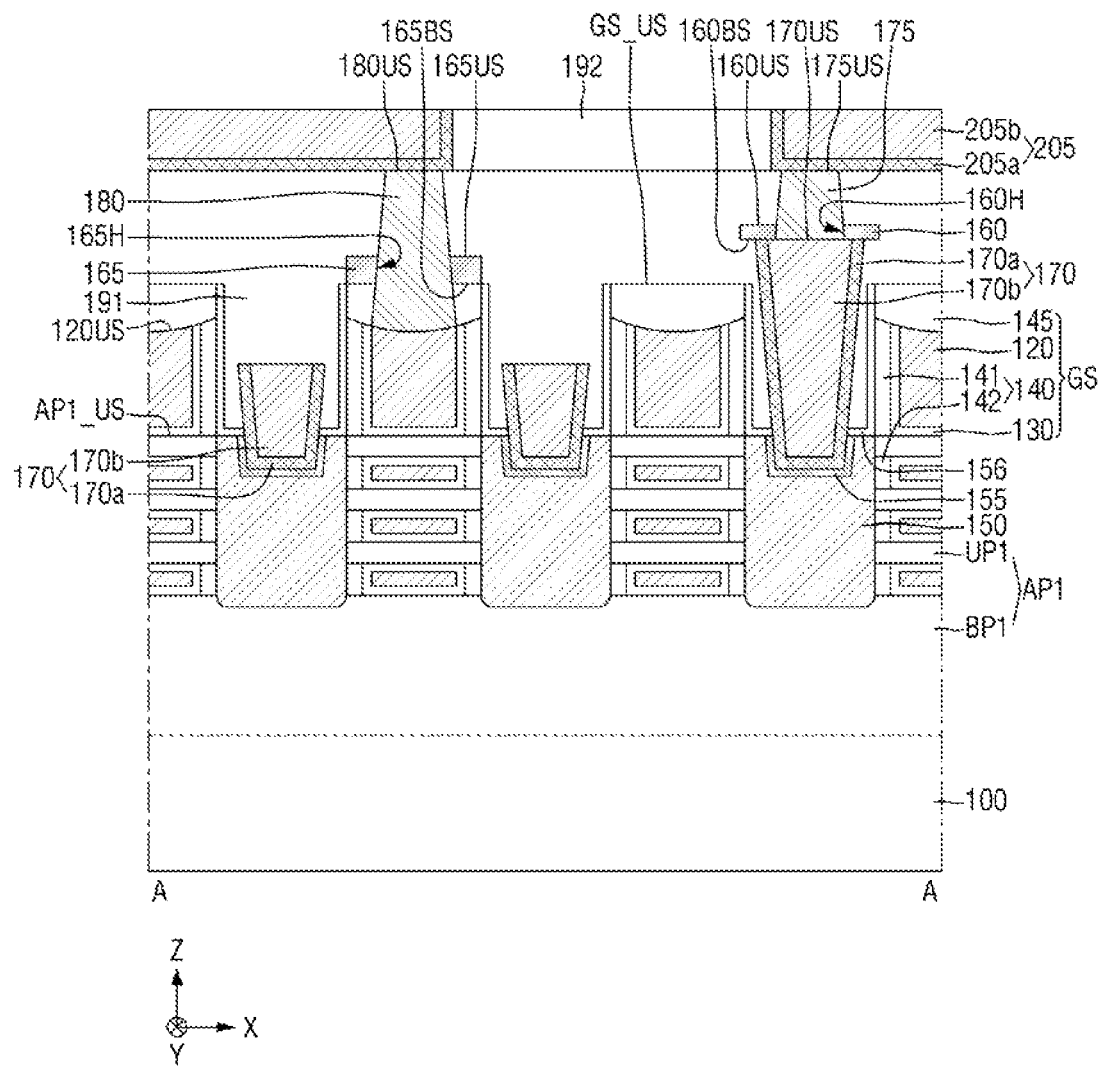
FIGS. 24 to 25 are cross-sectional views of a semiconductor device taken along line A-A of FIG. 23 according to some embodiments of the present disclosure.
Figure 25:
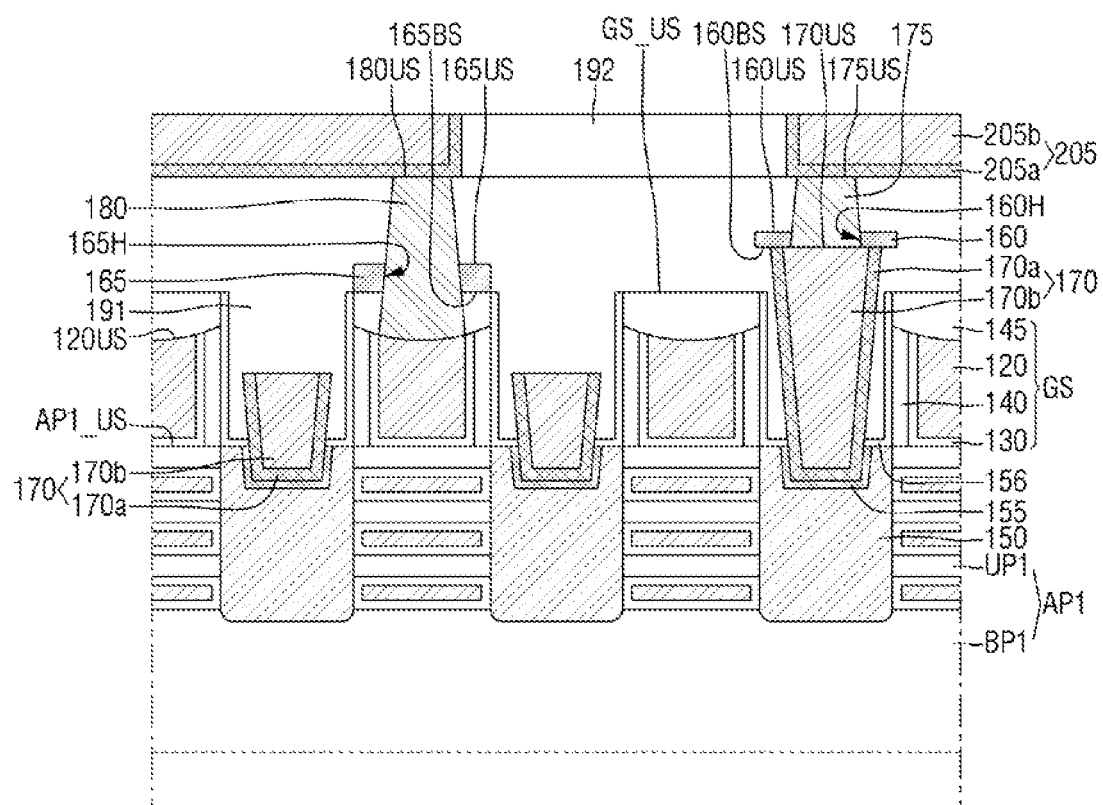
Figure 26:
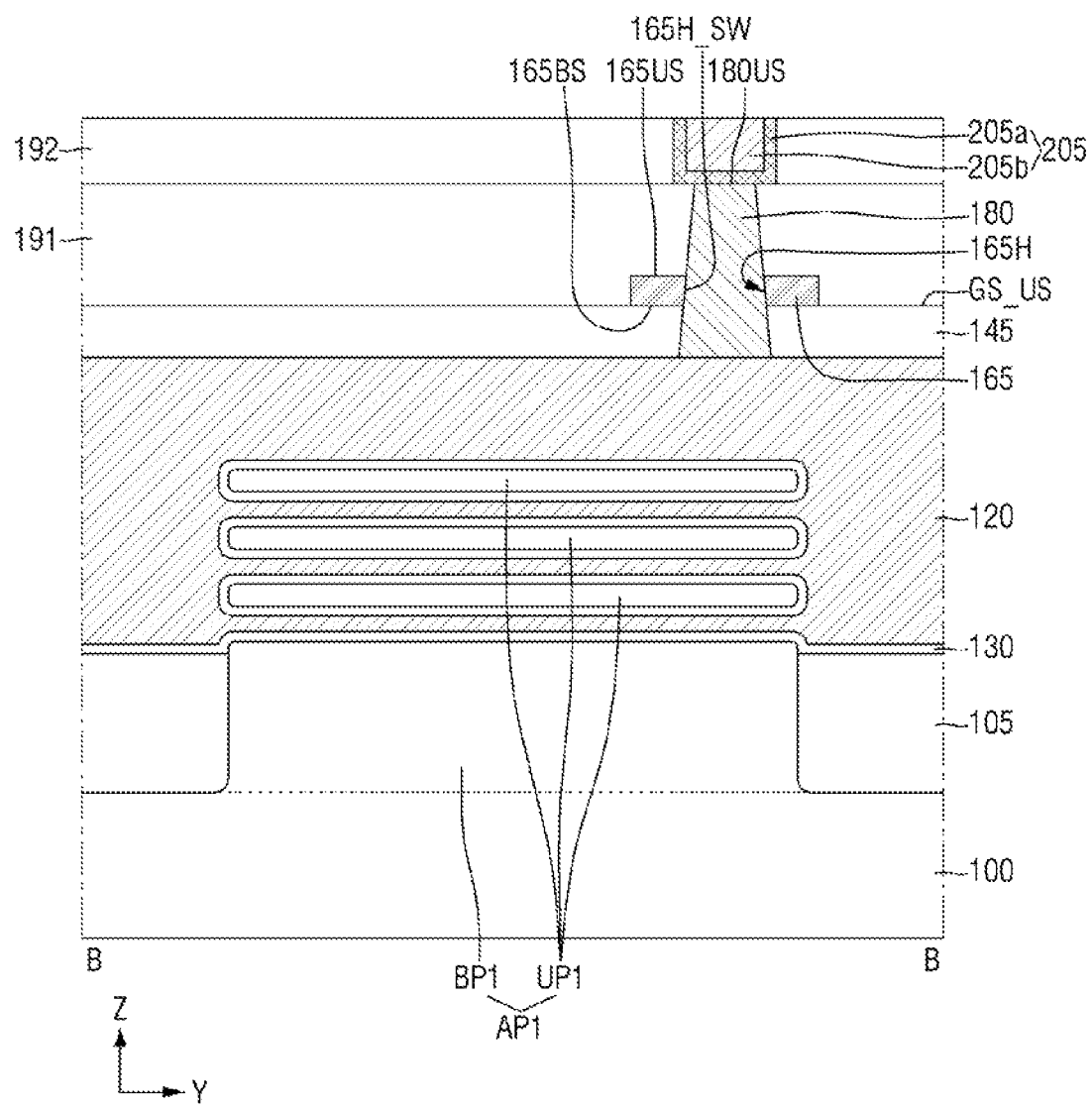
FIG. 26 is a cross-sectional view of a semiconductor device taken along line B-B of FIG. 23 according to an embodiment of the present disclosure.

FIGS. 23 to 26 are diagrams for explaining the semiconductor device according to some embodiments. FIG. 23 is an layout diagram for explaining the semiconductor device according to some embodiments. FIGS. 24 and 25 are cross-sectional views taken along A-A of FIG. 23, respectively. FIG. 26 is a cross-sectional view taken along B-B of FIG. 23. For convenience of explanation, points different from those described using FIGS. 1 to 6 will be mainly described and a repeated description of similar or identical elements may be omitted.

Referring to FIGS. 23 to 26, in the semiconductor device according to some embodiments, the first active pattern AP1 may include a lower pattern BP1 and a sheet pattern UP1.

In an embodiment, the second active pattern AP2 may include a lower pattern and a sheet pattern.

The lower pattern BP1 may extend along the first direction X. The sheet pattern UP1 may be disposed on the lower pattern BP1 to be spaced apart from the lower pattern BP1.

The sheet pattern UP1 may include a plurality of sheet patterns stacked in the third direction Z. Although the three sheet patterns UP1 are shown, this is merely for convenience of explanation, and embodiments of the present disclosure are not necessarily limited thereto.

The sheet pattern UP1 may be connected to the first source/drain pattern 150. The sheet pattern UP1 may be a channel pattern used as a channel region of a transistor. For example, the sheet pattern UP1 may be a nanosheet or a nanowire. The upper surface AP1_US of the first active pattern may be the upper surface of the sheet pattern UP1 disposed at the uppermost part among the sheet patterns UP1.

In an embodiment, the lower pattern BP1 may include, for example silicon or germanium, which is an elemental semiconductor material. Alternatively, the lower pattern BP1 may include a compound semiconductor, for example, an IV-IV group compound semiconductor or a III-V group compound semiconductor.

The sheet pattern UP1 may include for example, silicon or germanium, which is an elemental semiconductor material. Alternatively the sheet pattern UP1 may include a compound semiconductor, and may include, for example, an IV-IV group compound semiconductor or a III-V group compound semiconductor.

The gate insulating film 130 may extend along the upper surface of the lower pattern BP1 and the upper surface of the field insulating film 105. The gate insulating film 130 may wrap around the sheet pattern UP1.

The gate electrode 120 is disposed on the lower pattern BP1. The gate electrode 120 intersects the lower pattern BP1. The gate electrode 120 may wrap around the sheet pattern UP1. The gate electrode 120 may be disposed between the lower pattern BP1 and the sheet pattern UP1, and between the adjacent sheet patterns UP1.

In FIG. 24, the gate spacer 140 may include an outer spacer 141 and an inner spacer 142. The inner spacer 142 may be disposed between the lower pattern BP1 and the sheet pattern UP1, and between the adjacent sheet patterns UP1.

In FIG. 25, the gate spacer 140 may include only the outer spacer 141. An inner spacer 142 may not be disposed between the lower pattern BP1 and the sheet pattern UP1, and between the adjacent sheet patterns UP1.

Figure 27:
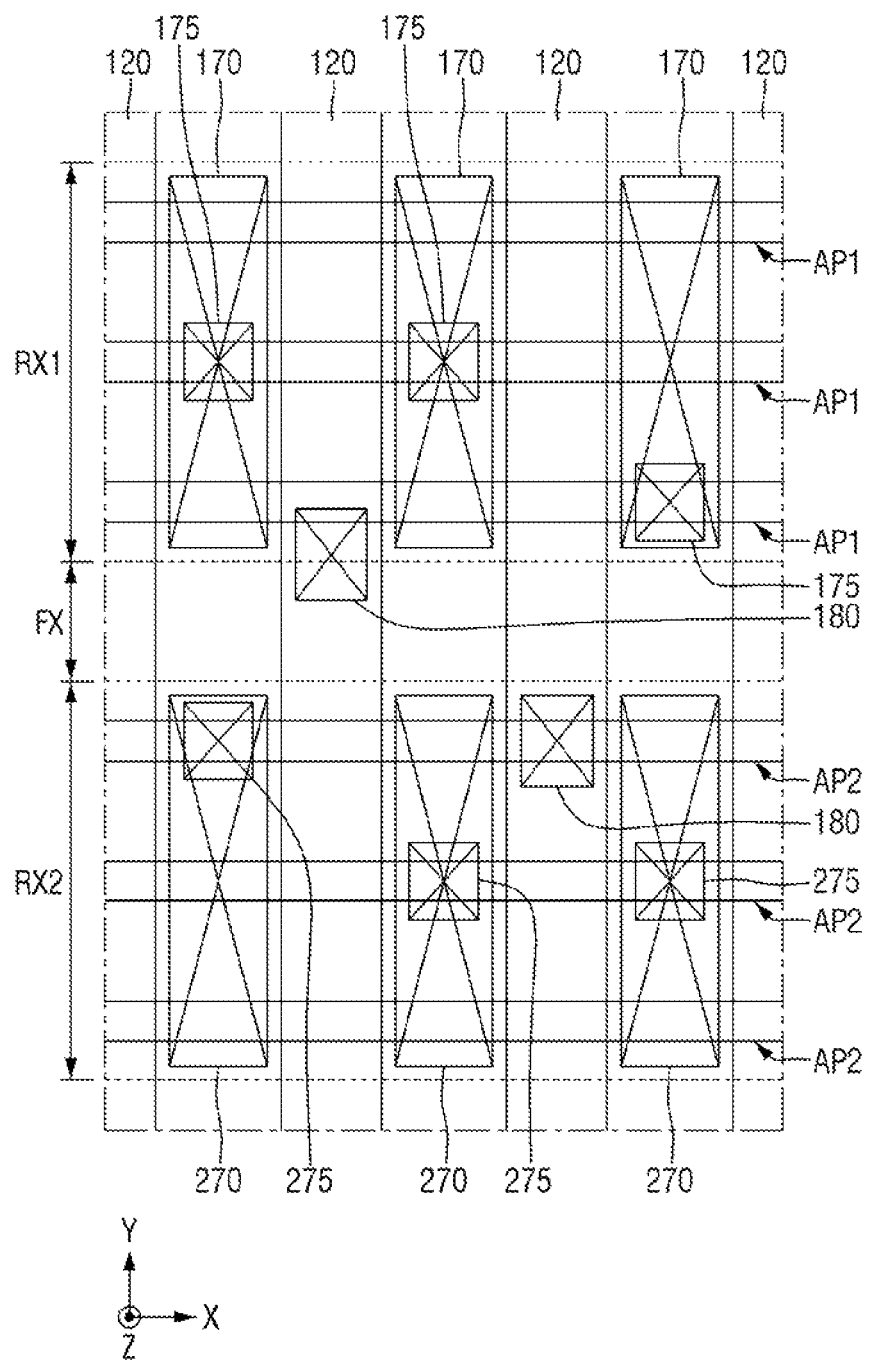
FIGS. 27 and 28 are layout diagrams of a semiconductor device according to some embodiments of the present disclosure.
Figure 28:
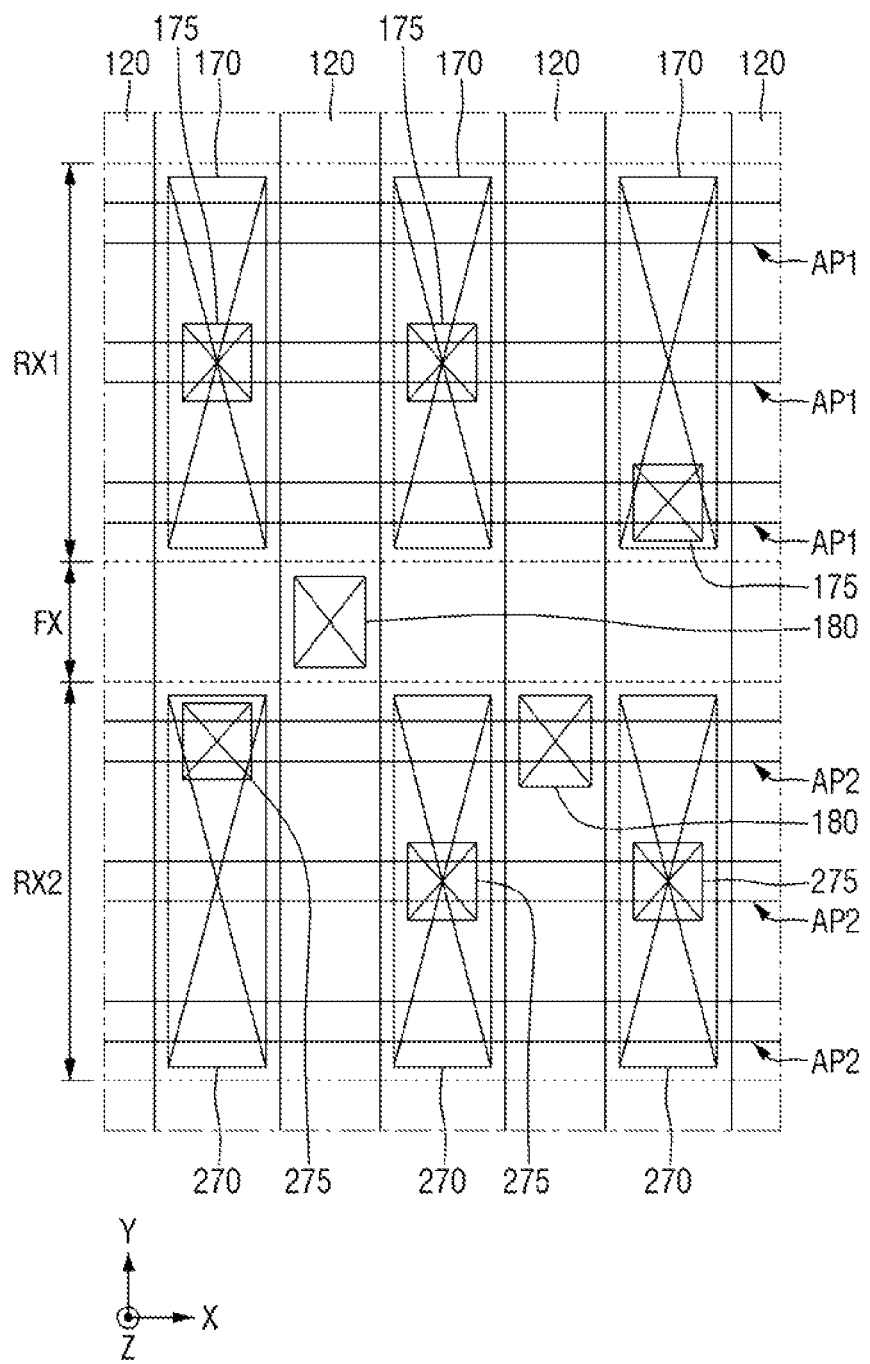

FIGS. 27 and 28 are layout diagrams for explaining a semiconductor device according to some embodiments, respectively. For convenience of explanation, points different from those described using FIGS. 1 to 6 will be mainly described and a repeated description of similar or identical elements may be omitted.

Referring to FIG. 27, in the semiconductor device according to some embodiments, at least one of the gate contacts 180 may be disposed over the active regions RX1 and RX2 and the field region FX from the viewpoint of the plan view.

For example, a portion of the gate contact 180 may be disposed at a position at which it overlaps the first active region RX1 and another portion of the gate contact 180 may be disposed at a position at which it overlaps the field region FX. In an embodiment, a portion of the gate contact 180 may be disposed at a position at which it overlaps the second active region RX2 and another portion of the gate contact 180 may be disposed at a position at which it overlaps the field region F.

Referring to FIG. 28, in the semiconductor device according to some embodiments, at least one of the gate contacts 180 may be disposed generally in the field region FX from the viewpoint of the plan view.

At least one of the gate contacts 180 may be disposed at a position at which it generally overlaps the field region FX.

In FIGS. 27 and 28, although at least the other of the gate contacts 180 is shown to be generally disposed on the second active region RX2, embodiments of the present disclosure are not necessarily limited thereto.

In FIGS. 1, 27 and 28, the cross section of each first source/drain contact 170 (a diagram taken in the second direction Y) and the cross section of the second source/drain contact 270 may have an "L" shape or may have a shape rotated by 180 degrees, depending on the position of the gate contact 180.

Alternatively, regardless of the position of the gate contact 180, each of the first source/drain contact 170 and the second source/drain contact 270 may not include the recessed portion as in FIG. 6.

FIGS. 29 to 39 are intermediate stage diagrams for explaining a method for manufacturing a semiconductor device according to some embodiments. For reference, FIGS. 29 to 39 may be cross-sectional views taken along A-A of FIG. 1. The following manufacturing method will be described from the viewpoint of a cross-sectional view.

Figure 29:
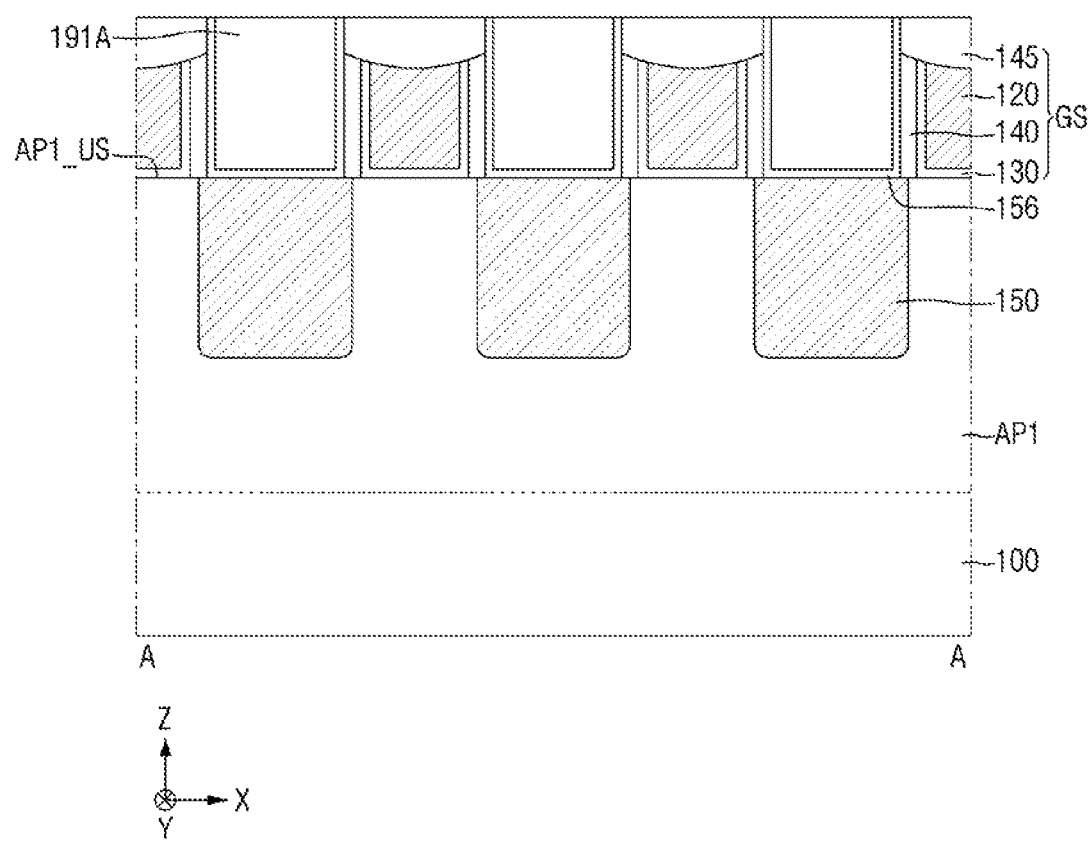
FIGS. 29 to 39 are cross-sectional views taken along line A-A of FIG. 1 of intermediate stage diagrams of a method for manufacturing a semiconductor device according to some embodiments of the present disclosure.

Referring to FIG. 29, a gate structure GS and a first source/drain pattern 150 may be formed on the first active pattern AP1.

A source/drain etching stop film 156 is formed on the first source/drain pattern 150. Subsequently, the first portion 191A of the first interlayer insulating film is formed on the source/drain etching stop film 156. The upper surface of the first portion 191A of the first interlayer insulating film exposes the upper surface of the gate structure GS.

Figure 30:
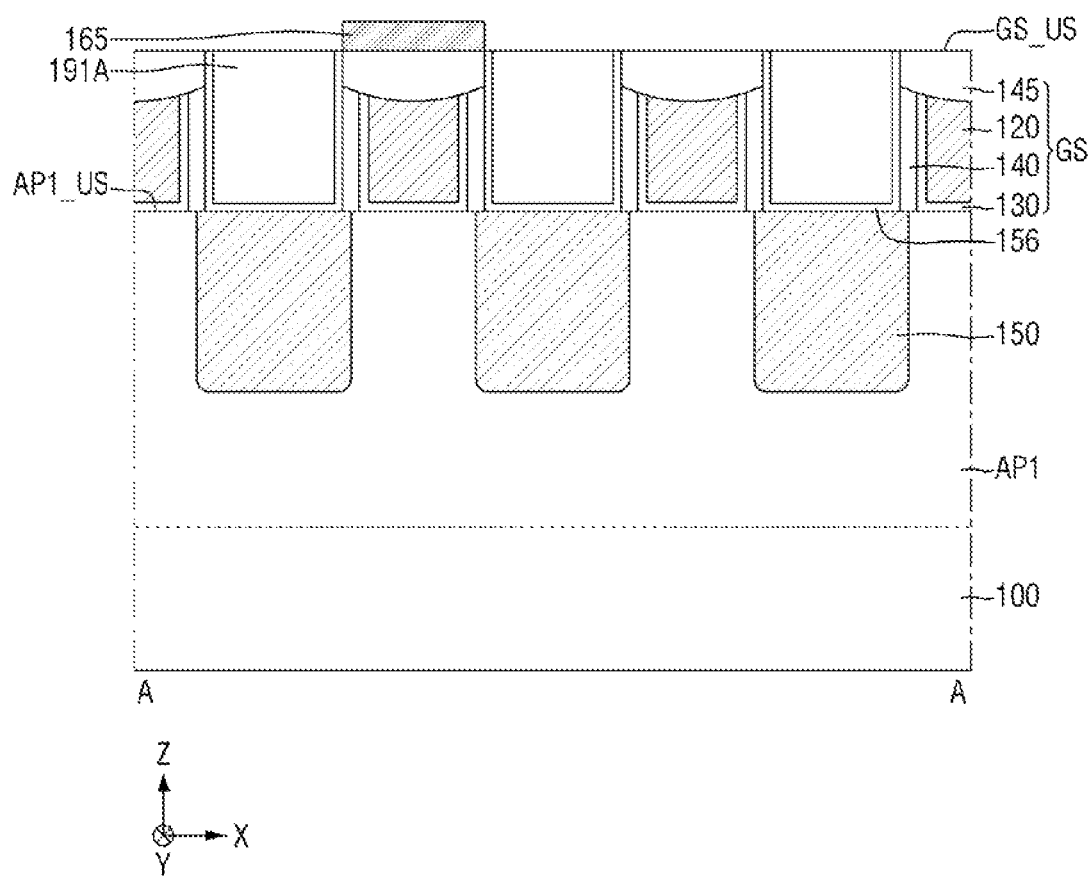

Referring to FIG. 30, the second conductive pad 165 may be formed on the upper surface GS_US of the gate structure. For example, in an embodiment, an entirety of the lower surface of the second conductive pad 165 is disposed on the upper surface GS_US of the gate structure.

The second conductive pad 165 may be in direct contact with the upper surface GS_US of the gate structure.

Figure 31:
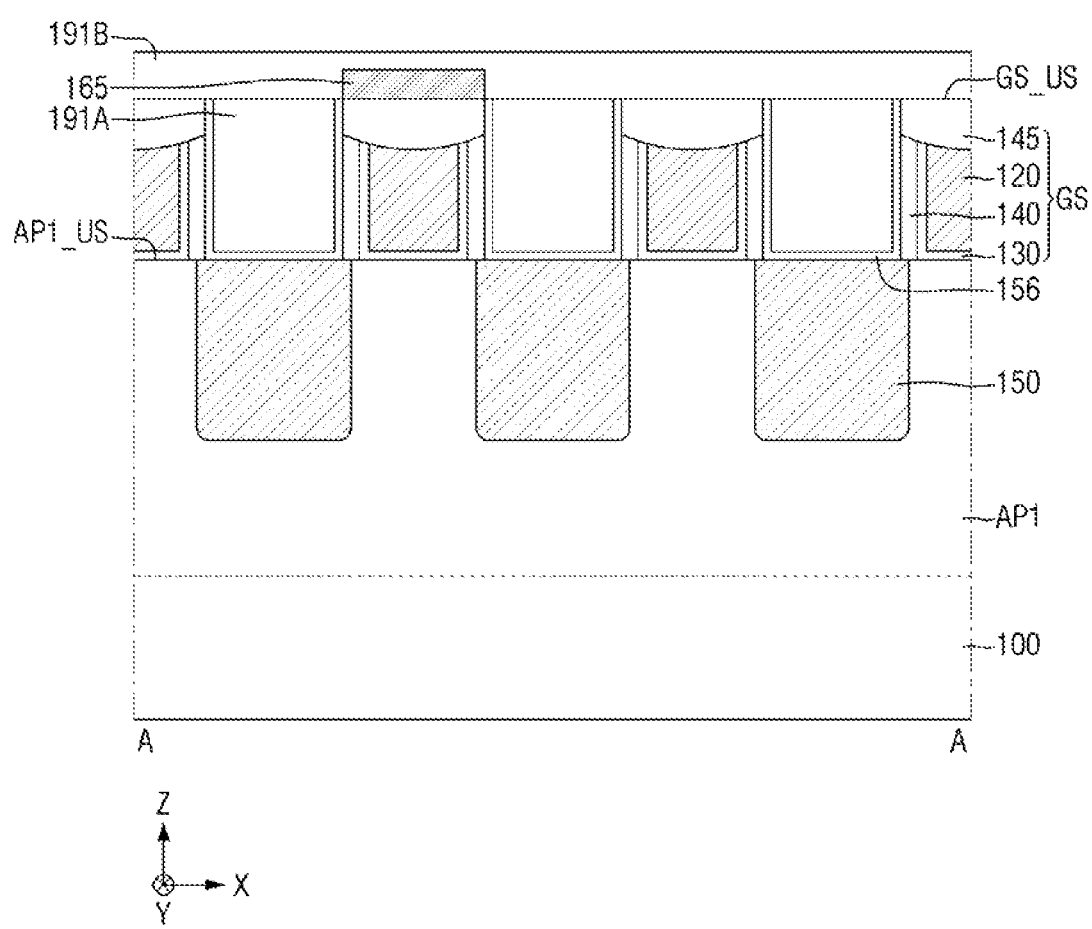

Referring to FIG. 31, a second portion 191B of the first interlayer insulating film may be formed on a first portion 191A of the first interlayer insulating film.

The second portion 191B of the first interlayer insulating film may cover the upper surface of the gate structure GS_US and the upper surface of the second conductive pad 165.

Figure 32:
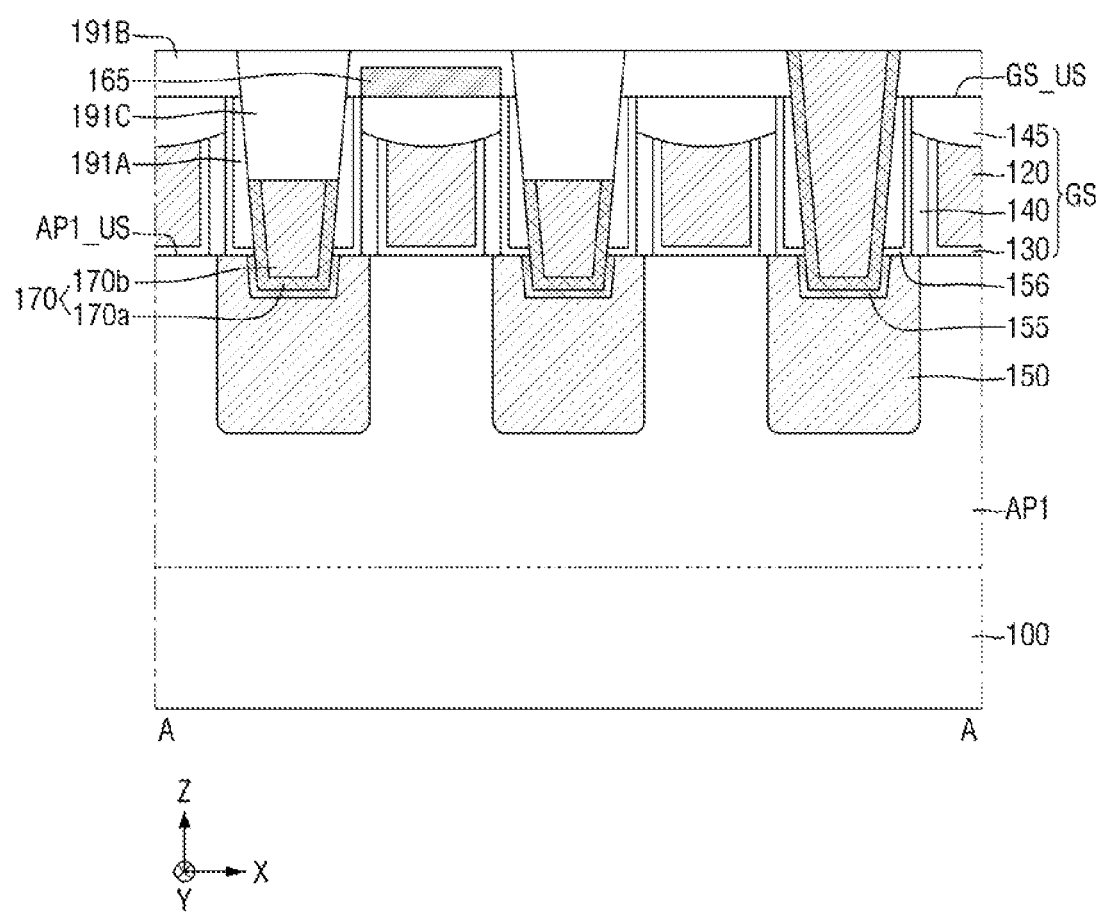

Referring to FIG. 32, the first source/drain contact 170 is formed on the first source/drain pattern 150.

For example, a source/drain contact hole that exposes the first source/drain pattern 150 is formed inside the first portion 191A of the first interlayer insulating film and the second portion 191B of the first interlayer insulating film.

A pre source/drain contact may be formed inside the source/drain contact hole and on the upper surface of the second portion 191B of the first interlayer insulating film.

The pre source/drain contact on the upper surface of the second portion 191B of the first interlayer insulating film may be removed through the flattening process. In an embodiment, the flattening process may be, for example, but is not necessarily limited to, a chemical mechanical polishing (CMP) process. Accordingly, the first source/drain contact 170 may be formed inside the source/drain contact hole. Subsequently, a portion of the first source/drain contact 170 of the portion that is not connected to the wiring line (205 of FIG. 2) may be removed.

Subsequently, a third portion 191C of the first interlayer insulating film may be formed in the source/drain contact hole that remains after the first source/drain contact 170 is formed.

An upper surface of the third portion 191C of the first interlayer insulating film may be disposed on the same plane as the upper surface of the first source/drain contact 170. For example, the upper surface of the third portion 191C of the first interlayer insulating film may be co-planar with the upper surface of the first source/drain contact 170 in the third direction Z.

However, embodiments of the present disclosure are not necessarily limited thereto. For example, in an embodiment, unlike the shown example, the upper surface of the second conductive pad 165 may be exposed, while the flattening process of forming the first source/drain contact 170 is formed.

Figure 33:
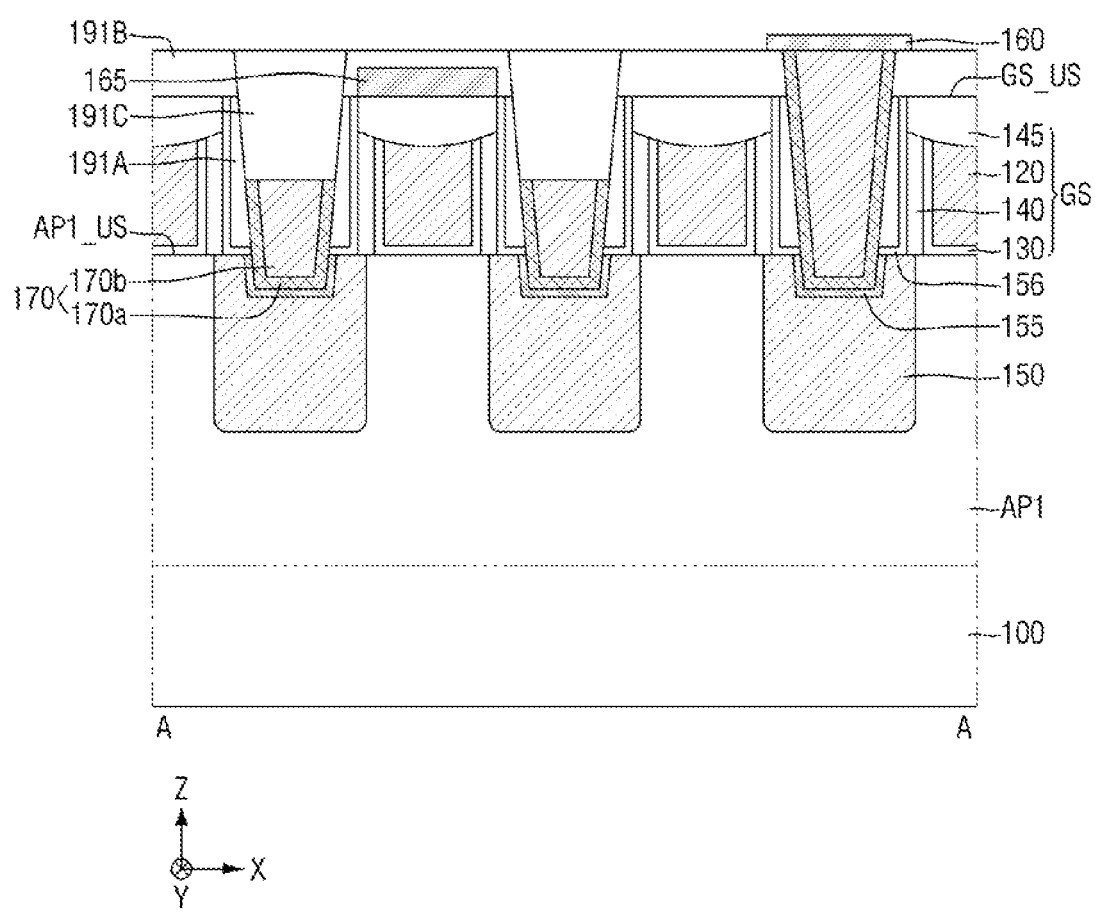

Referring to FIG. 33, the first conductive pad 160 may be formed on the first source/drain contact 170.

The first conductive pad 160 may be in direct contact with the first source/drain contact 170.

Figure 34:
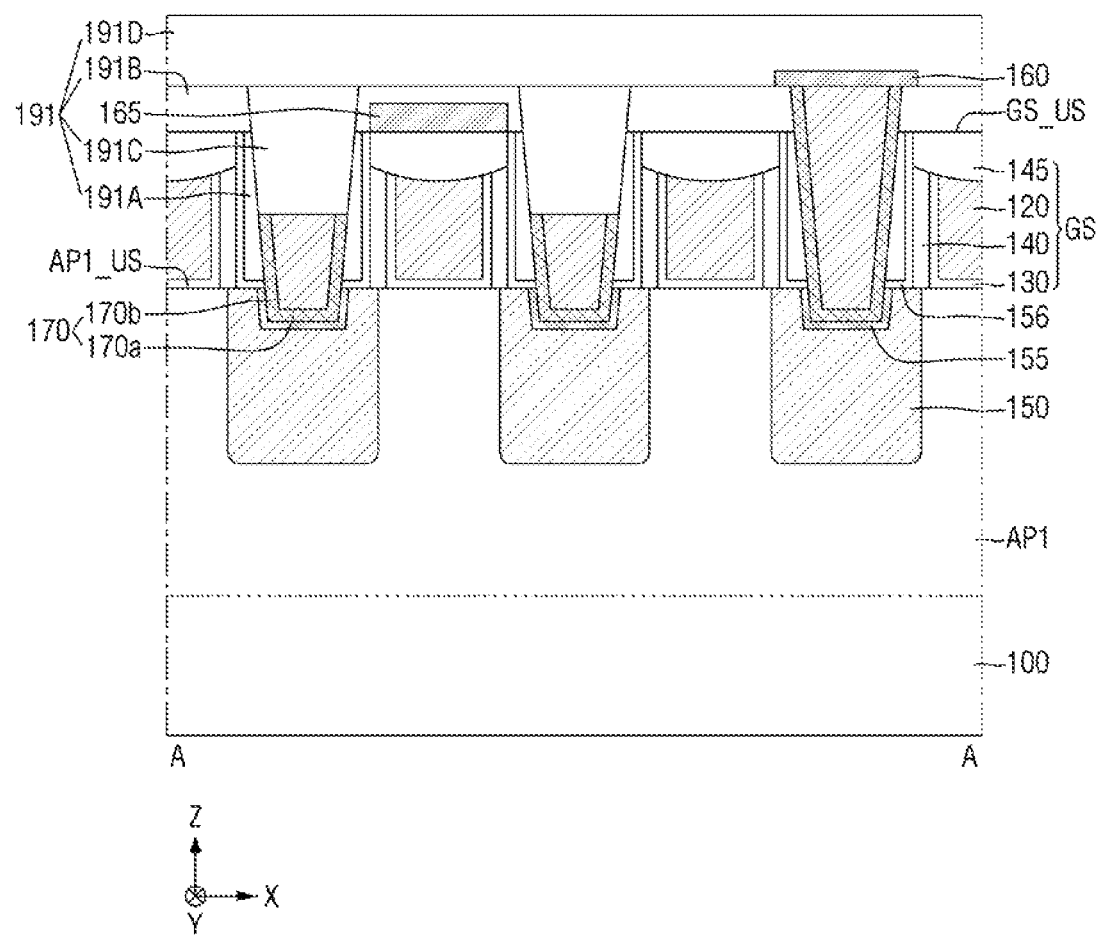

Referring to FIG. 34, a fourth portion 191D of the first interlayer insulating film is formed on the second portion 191B of the first interlayer insulating film, the third portion 191C of the first interlayer insulating film, and the first conductive pad 160.

The fourth portion 191D of the first interlayer insulating film covers the upper surface of the first conductive pad 160.

The first interlayer insulating film 191 may include the first portion 191A of the first interlayer insulating film, the second portion 191B of the first interlayer insulating film, the third portion 191C of the first interlayer insulating film, and the fourth portion 191D of the first interlayer insulating film.

Figure 35:
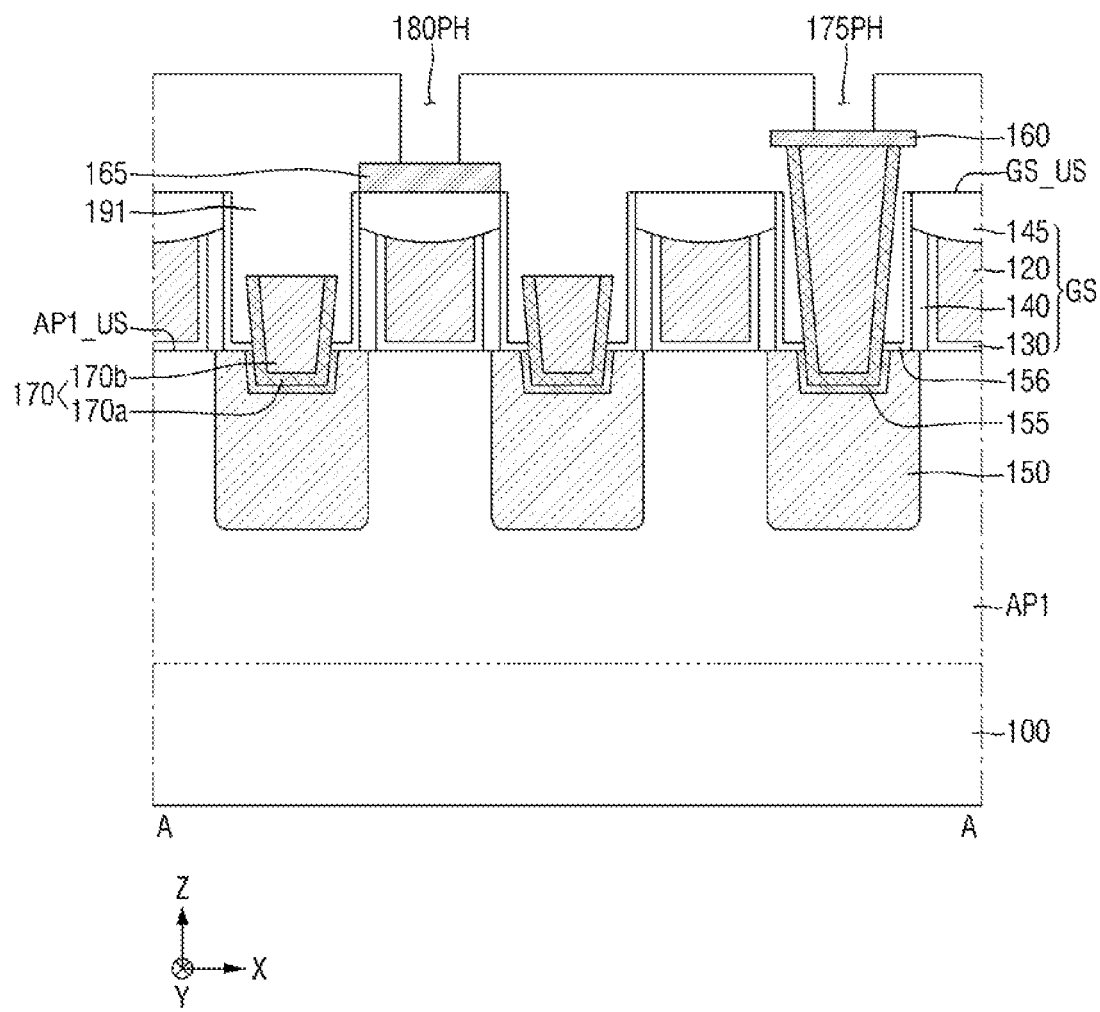

Referring to FIG. 35, a pre via plug hole 175PH and a pre gate contact hole 180PH are formed inside the first interlayer insulating film 191.

The pre via plug hole 175PH exposes the first conductive pad 160. The pre gate contact hole 180PH exposes the second conductive pad 165.

Figure 36:
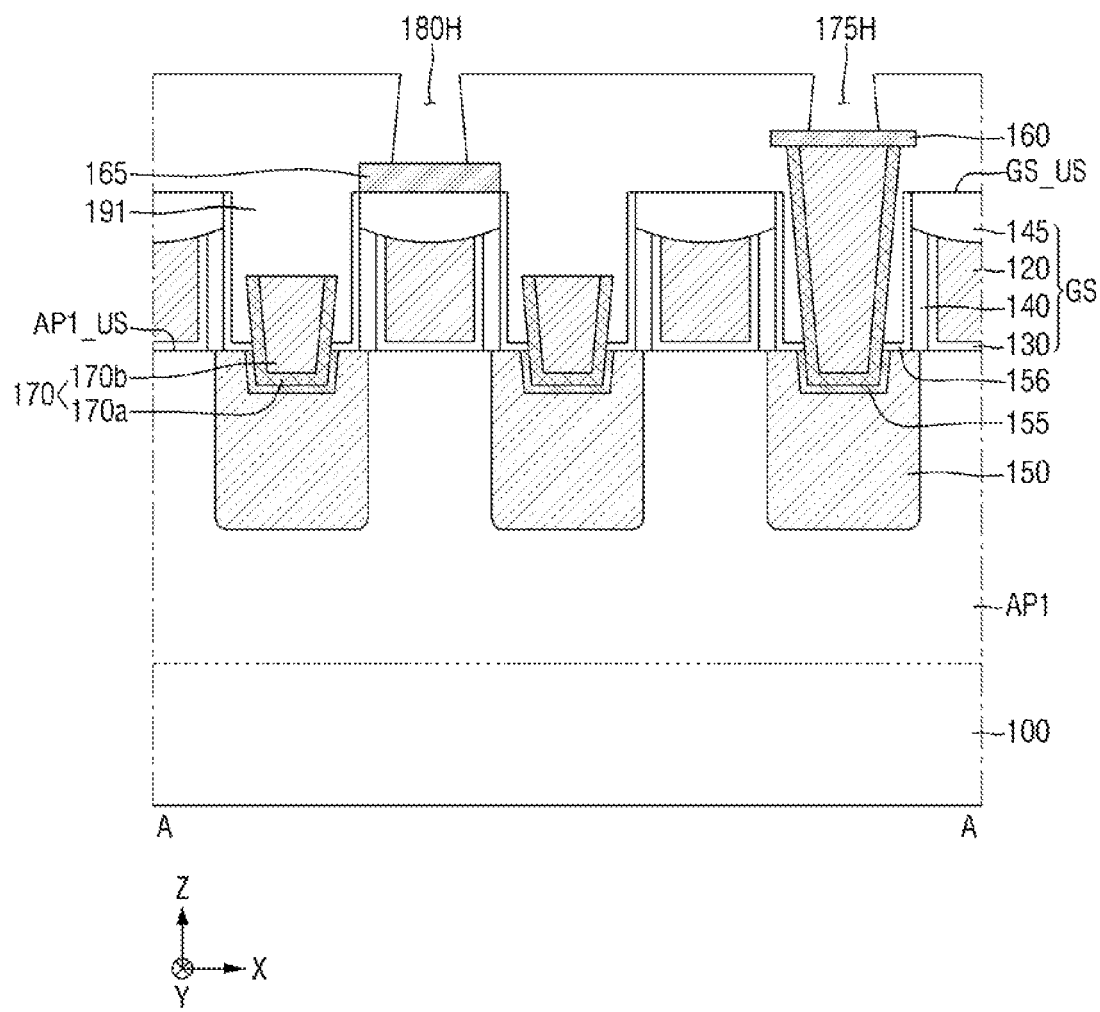

Referring to FIG. 36, the first interlayer insulating film 191 is subjected to a suppressed treatment to form a via plug hole 175H and a gate contact hole 180H inside the first interlayer insulating film 191.

The width of the lower portion of the pre via plug hole 175PH and the width of the lower portion of the pre gate contact hole 180PH may be widened through the suppressed treatment.

Figure 37:
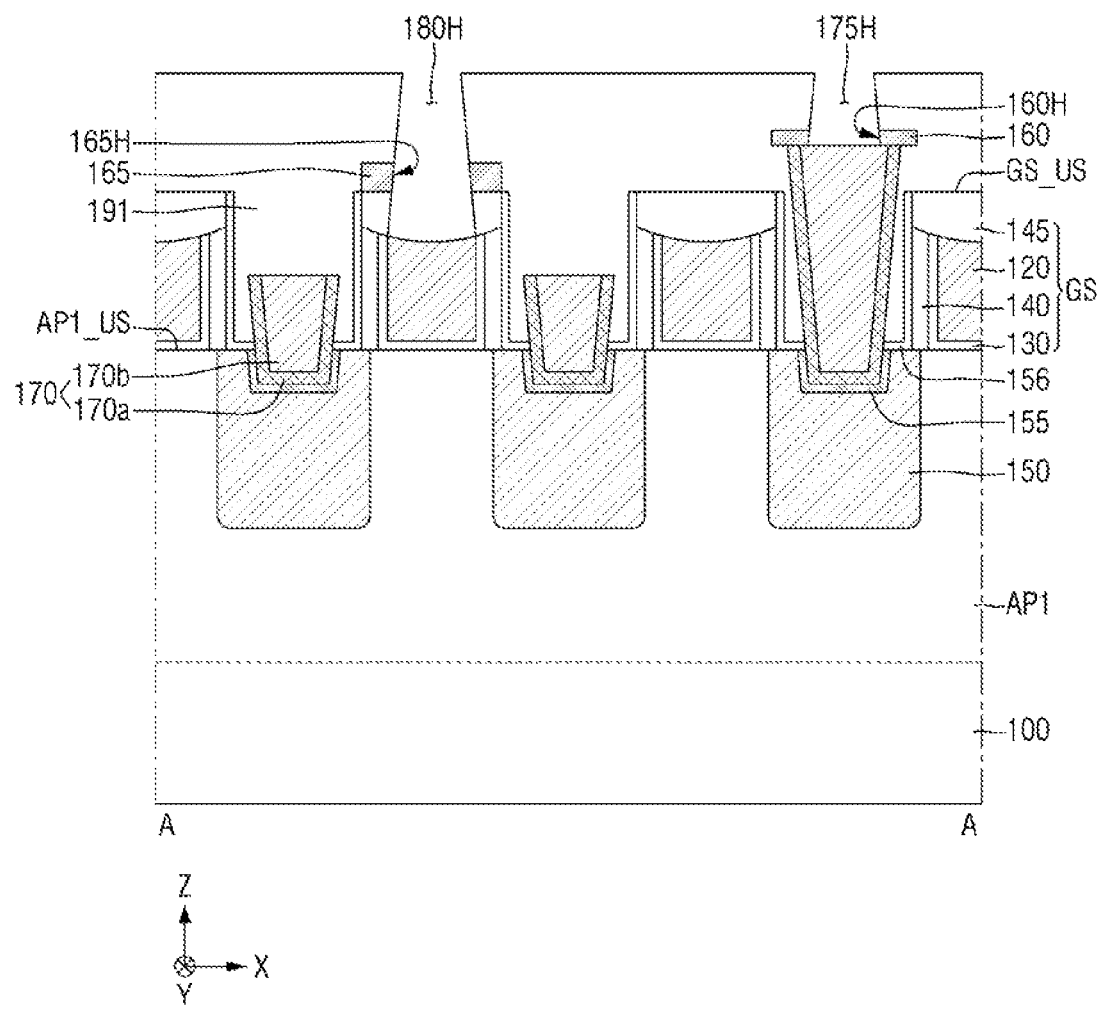

Referring to FIG. 37, the first conductive pad 160 exposed by the via plug hole 175H is removed, and the via plug hole 175H extends to the upper surface of the first source/drain contact 170. While the via plug hole 175H is formed, the first pad through hole 160H is formed.

The second conductive pad 165 and the gate capping pattern 145 exposed by the gate contact hole 180H are sequentially removed, and the gate contact hole 180H extends to the upper surface of the gate electrode 120. While the gate contact hole 180H is formed, the second pad through hole 165H is formed.

The via plug hole 175H exposes the upper surface of the first source/drain contact 170. The gate contact hole 180H exposes the upper surface of the gate electrode 120.

Figure 38:
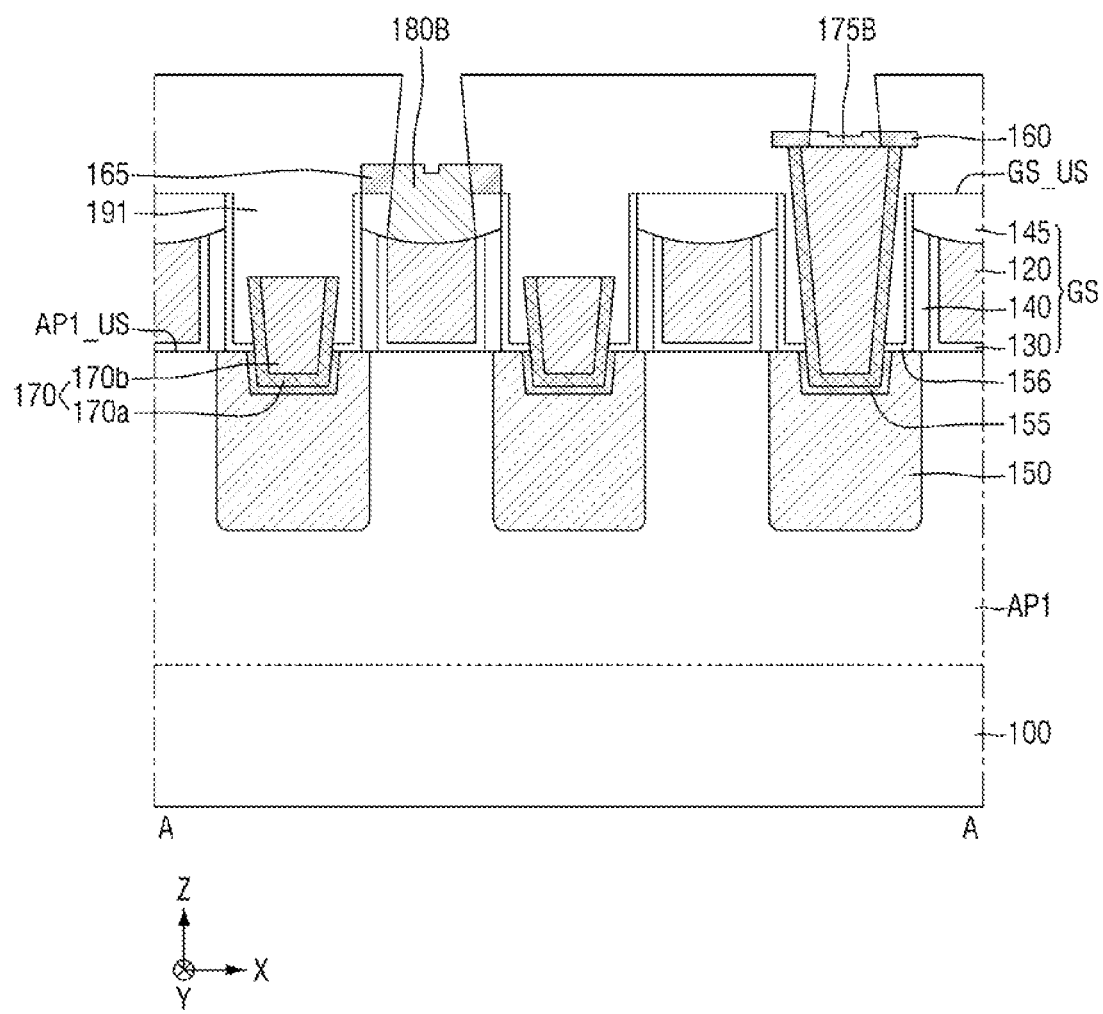
Figure 39:
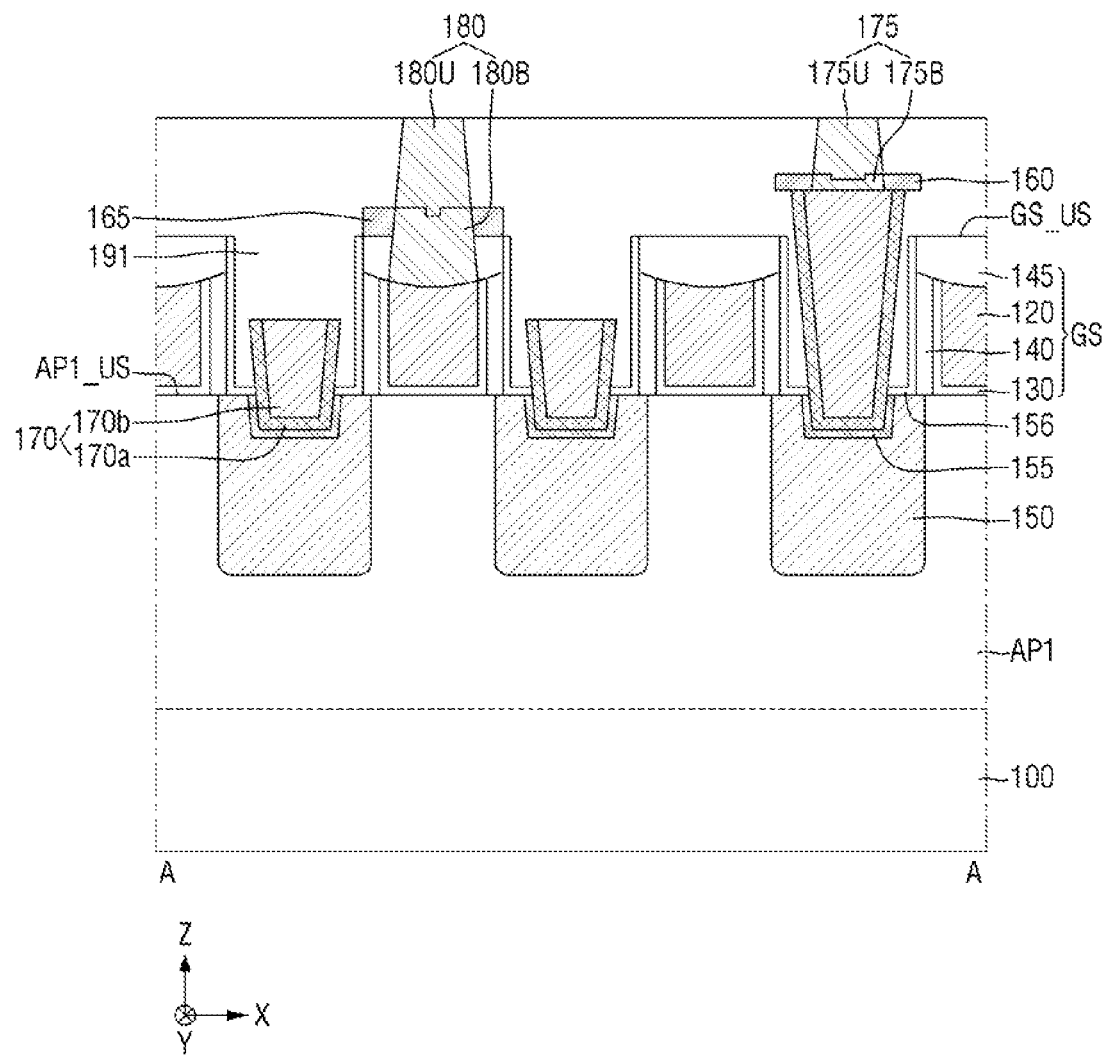

Referring to FIG. 38, a lower via plug 175B is formed inside the via plug hole 17511 through the selective growth. The lower via plug 175B grows on the exposed first source/drain contact 170 and the first conductive pad 160.

A lower gate contact 180B is formed inside the gate contact hole 180H through the selective growth. The lower gate contact 180B grows on the exposed gate electrode 120 and the second conductive pad 165.

In an embodiment, the lower via plug 175B and the lower gate contact 180B are formed at the same time.

Referring to FIG. 19, an upper via plug 175U that fills the via plug hole 175H is formed through the selective growth.

An upper gate contact 180U that fills the gate contact hole 180H is formed through the selective growth.

In an embodiment, the upper via plug 175U and the upper gate contact 180U are formed at the same time.

The first via plug 175 connected to the first source/drain contact 170 is formed inside the via plug hole 175H. The gate contact 180 connected to the gate electrode 120 is formed inside the gate contact hole 180H.

Next, referring to FIG. 2, the wiring line 205 is formed on the first interlayer insulating film 191.

In concluding the detailed description, those skilled in the art will appreciate that many variations and modifications may be made to the described embodiments without substantially departing from the principles of the present inventive concept. Therefore, the disclosed embodiments of the present disclosure are used in a generic and descriptive sense only and not for purposes of limitation.

What is claimed is:

1. A semiconductor device comprising:
   a gate structure including a gate electrode on a substrate;
   a source/drain pattern disposed on the substrate and positioned on a side surface of the gate electrode;
   a source/drain contact disposed on the source/drain pattern and connected to the source/drain pattern;
   a first conductive pad on the source/drain contact;
   a second conductive pad on the gate structure;
   a via plug penetrating the first conductive pad and connected to the source drain contact; and
   a gate contact penetrating the second conductive pad and connected to the gate electrode,
   wherein a portion of the via plug protrudes from an upper surface of the first conductive pad,
   a portion of the gate contact protrudes from an upper surface of the second conductive pad, and
   a height from an upper surface of the gate structure to an upper surface of the via plug is equal to a height from the upper surface of the gate structure to an upper surface of the gate contact.

2. The semiconductor device of claim 1, wherein:
   a width of the upper surface of the via plug is less than a width of the via plug disposed on the upper surface of the first conductive pad; and
   a width of the upper surface of the gate contact is less than a width of the gate contact disposed on the upper surface of the second conductive pad.

3. The semiconductor device of claim 2, wherein a width of the source/drain contact increases as a distance from the substrate increases.

4. The semiconductor device of claim 1, wherein:
   the first conductive pad includes a pad through hole; and
   the via plug directly contacts side walls of the pad through hole.

5. The semiconductor device of claim 1, wherein the upper surface of e gate structure is lower than the upper surface of the source/drain contact.

6. The semiconductor device of claim 5, wherein a height from the upper surface of the gate structure to the upper surface of the second conductive pad is equal to a height from the upper surface of the gate structure to the upper surface of the source/drain contact.

7. The semiconductor device of claim 1, wherein the upper surface of the gate structure is disposed on a same plane as the upper surface of the source drain contact.

8. The semiconductor device of claim 1, wherein a thickness of the second conductive pad is greater than or equal to a thickness of the first conductive pad.

9. The semiconductor device of claim 1, wherein:
   the via plug includes a lower via plug and an upper via plug on the lower via plug; and
   the lower via plug is directly connected to the source drain contact and disposed in the first conductive pad.

10. The semiconductor device of claim 9, wherein the lower via plug and the upper via plug each have a single material film structure.

11. The semiconductor device of claim 1, wherein an entirety of a lower surface of the second conductive pad is disposed on the upper surface of the gate structure.

12. The semiconductor device of claim 1, wherein the gate contact and the via plug each have a single material structure.

13. A semiconductor device comprising:
   a gate structure on a substrate, the gate structure including a gate electrode and a gate capping pattern on the gate electrode;
   a source/drain pattern disposed on the substrate and positioned on a side surface of the gate electrode;
   a source/drain contact disposed on the source/drain pattern and connected to the source/drain pattern;
   a first conductive pad on the source/drain contact;
   a second conductive pad on the gate capping pattern;
   a via plug penetrating the first conductive pad and connected to the source/drain contact; and
   a gate contact penetrating the second conductive pad and the gate capping pattern, and connected to the gate electrode,
   wherein a width of the via plug decreases as a distance from an upper surface of the first conductive pad increases, and
   a width of the gate contact decreases as a distance from an upper surface of the second conductive pad increases.

14. The semiconductor device of claim 13, wherein:
   the via plug includes a lower via plug and an upper via plug on the lower via plug; and
   the lower via plug is directly connected to the source/drain contact and disposed in the first conductive pad.

15. The semiconductor device of claim 14, wherein:
   the first conductive pad includes a pad through hole; and
   the lower via plug directly contacts side walls of the pad through hole.

16. The semiconductor device of claim 13, wherein the gate contact and the via plug each have a single material film structure.

17. The semiconductor device of claim 13, wherein a thickness of the second conductive pad is greater than or equal to a thickness of the first conductive pad.

18. A semiconductor device comprising:
   a multi-channel active pattern on a substrate;

a gate structure that is disposed on the multi-channel active pattern, the gate structure includes a gate electrode and a gate capping pattern, the gate capping pattern is disposed on the gate electrode;
a source/drain pattern disposed on the substrate and positioned on a side surface of the gate electrode;
a source/drain contact disposed on the source/drain pattern and connected to the source/drain pattern;
a first conductive pad on the source/drain contact;
a second conductive pad on the gate capping pattern;
a via plug penetrating the first conductive pad and connected to the source/drain contact; and
a gate contact penetrating the second conductive pad and the gate capping pattern and connected to the gate electrode,
wherein the via plug includes a lower via plug disposed in the first conductive pad and an upper via plug on the lower via plug,
the gate contact includes a lower gate contact disposed in the second conductive pad and an upper gate contact on the lower gate contact,
a width of an upper surface of the upper via plug is less than a width of a lower surface of the via plug disposed on an upper surface of the first conductive pad, and
a width of an upper surface of the upper gate contact is less than a width of a lower surface of the gate contact disposed on an upper surface of the second conductive pad.

19. The semiconductor device of claim 18, wherein:
the lower via plug includes a same material as the lower gate contact;
the upper via plug includes a same material as the upper gate contact; and
the lower gate contact, the upper gate contact, the lower via plug, and the upper via plug each have a single material film structure.

20. The semiconductor device of claim 18, wherein a thickness of the second conductive pad is greater than or equal to a thickness of the first conductive pad.

* * * * *